United States Patent
Jo et al.

(10) Patent No.: US 11,289,150 B2
(45) Date of Patent: Mar. 29, 2022

(54) MEMORY SYSTEM AND OPERATING METHOD OF THE SAME

(71) Applicant: SAMSUNG ELECTRONICS CO., LTD., Suwon-si (KR)

(72) Inventors: Youngmin Jo, Hwaseong-si (KR); Taehyo Kim, Daegu (KR); Daeseok Byeon, Seongnam-si (KR); Seungwon Lee, Yongin-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

(21) Appl. No.: 17/196,183

(22) Filed: Mar. 9, 2021

(65) Prior Publication Data
US 2021/0375347 A1 Dec. 2, 2021

(30) Foreign Application Priority Data
Jun. 2, 2020 (KR) .................... 10-2020-0066674

(51) Int. Cl.
*G11C 11/40* (2006.01)
*G11C 11/4072* (2006.01)
*G11C 5/06* (2006.01)
*G11C 11/4093* (2006.01)
*G11C 11/4099* (2006.01)

(52) U.S. Cl.
CPC .......... *G11C 11/4072* (2013.01); *G11C 5/06* (2013.01); *G11C 11/4093* (2013.01); *G11C 11/4099* (2013.01)

(58) Field of Classification Search
CPC ... G11C 11/4072; G11C 5/06; G11C 11/4093; G11C 11/4099; G11C 13/0059
See application file for complete search history.

(56) References Cited

U.S. PATENT DOCUMENTS

| | | | |
|---|---|---|---|
| 8,140,862 B2 | 3/2012 | Yamaguchi | |
| 8,291,226 B2 | 10/2012 | Chun et al. | |
| 9,087,220 B2 | 7/2015 | Chang et al. | |
| 9,531,535 B2 | 12/2016 | Ma et al. | |
| 2014/0068277 A1 | 3/2014 | Metzger | |
| 2017/0262337 A1 | 9/2017 | Chang et al. | |
| 2018/0336088 A1* | 11/2018 | Jun | .......... G06F 3/064 |
| 2020/0233739 A1* | 7/2020 | Oh | ........ G06F 11/0751 |
| 2020/0241955 A1* | 7/2020 | Jun | .......... G06F 11/10 |

FOREIGN PATENT DOCUMENTS

JP 2018-148387 A 9/2018

* cited by examiner

*Primary Examiner* — Han Yang
(74) *Attorney, Agent, or Firm* — Sughrue Mion, PLLC

(57) ABSTRACT

A memory system is provided. The memory system includes a memory device having a plurality of memory cells; and a memory controller configured to control the memory device to: store write data in first memory cells from among the plurality of memory cells, identify a current charge amount of a first cell string including at least one of the first memory cells and a current charge amount of a second cell string adjacent to the first cell string, and store dummy data in at least one memory cell connected to the first cell string or the second cell string based on the current charge amount of the first cell string and the current charge amount of the second cell string.

20 Claims, 30 Drawing Sheets

MEMORY SYSTEM AND OPERATING METHOD OF THE SAME

CROSS-REFERENCE TO THE RELATED APPLICATION

This application claims priority from Korean Patent Application No. 10-2020-0066674, filed on Jun. 2, 2020, in the Korean Intellectual Property Office, the disclosure of which is incorporated herein by reference in its entirety.

BACKGROUND

1. Field

Methods, apparatuses and systems consistent with example embodiments relate to a memory system and an operating method of the same, and more particularly, to a memory system that additionally performs an operation for storing dummy data after an operation for storing data that needs security and an operating method of the same.

2. Related Art

As the Fourth Industrial Revolution and related innovative technologies have been implemented based on artificial intelligence (AI), types of data and throughput of data have increased very rapidly. Therefore, security of a wide range of data has become important and interest in security of mass storage devices has increased. In relation to data storage, security data such as security keys needs to be kept absolutely safe from hacking.

SUMMARY

Example embodiments provide a memory system for additionally performing an operation for writing dummy data after a write operation of data that needs security for security enhancement and an operation method thereof.

According to an aspect of an example embodiment, a memory system includes a memory device including a plurality of memory cells; and a memory controller configured to control the memory device to: store write data in first memory cells from among the plurality of memory cells, identify a current charge amount of a first cell string including at least one of the first memory cells and a current charge amount of a second cell string adjacent to the first cell string, and store dummy data in at least one memory cell connected to the first cell string or the second cell string based on the current charge amount of the first cell string and the current charge amount of the second cell string.

According to an aspect of an example embodiment, a memory system includes a memory device including a plurality of memory cells; and a memory controller configured to control the memory device to: store write data in first memory cells from among the plurality of memory cells, identify a memory cell group which corresponds to the first memory cells, generate dummy data based on charge amounts of second memory cells included in the identified memory cell group, and store the dummy data in the second memory cells.

According to an aspect of an example embodiment an operating method of a memory system including a memory device, the operating method including: storing write data in first memory cells of the memory device; identifying a current charge amount of a first cell string including at least one of the first memory cells and a current charge amount of a second cell string adjacent to the first cell string; and storing dummy data in at least one memory cell connected to the first cell string or the second cell string based on the current charge amount of the first cell string and the current charge amount of the second cell string.

BRIEF DESCRIPTION OF THE DRAWINGS

The above and other objects and features will become more apparent from the following description of example embodiments with reference to the accompanying drawings in which.

DETAILED DESCRIPTION

Figure 1:
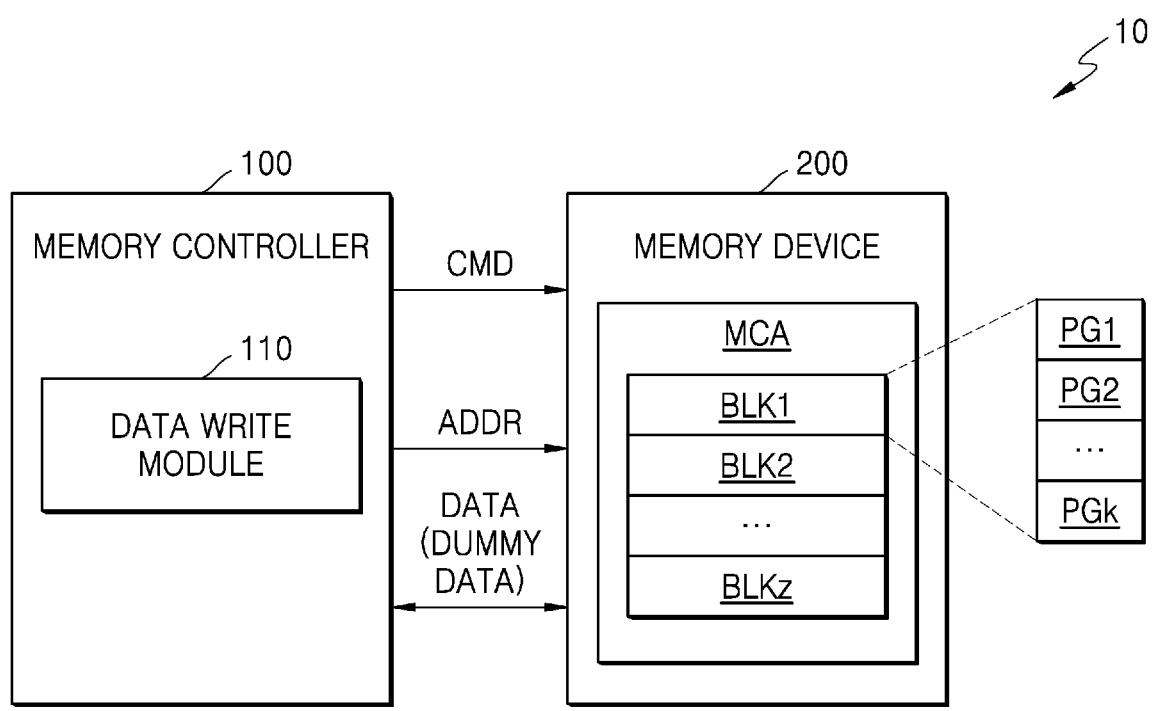
FIG. 1 is a block diagram of a memory system according to an example embodiment.

FIG. 1 is a block diagram showing a memory system 10 according to an example embodiment. Referring to FIG. 1, the memory system 10 may include a memory controller 100 and a memory device 200. In an example, the memory controller 100 and the memory device 200 may be implemented as separate chips.

The memory system 10 may include storage media for storing data. For example, the memory system 10 may include one or more solid state drives (SSDs). However, example embodiments are not limited thereto, and the memory system 10 may include any of various types of devices like an embedded multimedia card (eMMC), a universal flash storage (UFS), a compact flash (CF), a secure digital (SD), a micro secure digital (Micro-SD), a mini secure digital (Mini-SD), an extreme digital (xD), or a memory stick.

When the memory system 10 includes an SSD, the memory device 200 may include a plurality of flash memory chips (e.g., NAND memory chips) that non-volatilely store data. Alternatively, the memory device 200 may correspond to one flash memory device, or the memory device 200 may include a memory card including one or more flash memory chips.

When the memory system 10 includes a flash memory device, the flash memory device may include a 2D NAND memory array or a 3D (or vertical) NAND (VNAND) memory array. The 3D memory array includes arrays of memory cells that are arranged on a silicon substrate and have active regions or a circuit related to operations of the memory cells and is monolithically formed on the substrate or in at least one physical level of a circuit formed in the substrate. The term "monolithic" indicates that layers of levels constituting the 3D memory array are stacked directly on layers of lower levels of the 3D memory array.

In an example embodiment, the 3D memory array includes vertical NAND strings arranged in a vertical direction, such that at least one memory cell is positioned on top of another memory cell. The at least one memory cell may include a charge trapping layer.

U.S. Pat. Nos. 7,679,133, 8,553,466, 8,654,587, and 8,559,235 and U.S. Patent Application Publication No. 2011/0233648, the contents of which are incorporated herein by reference in their entireties, disclose appropriate configurations regarding a 3D memory array in which a plurality of levels are provided and word lines and/or bit lines are shared between the levels.

In another example, the memory system 10 may include various other types of memories. For example, the memory system 10 may include a non-volatile memory, and the non-volatile memory may be any of various types of memories like a magnetic memory (MRAM), a spin-transfer torque MRAM, a conductive bridging RAM (CBRAM), a ferroelectric RAM (FeRAM), a phase RAM (PRAM), a resistive RAM, a nanotube RAM, a polymer RAM (PoRAM), a nano floating gate memory (NFGM), a holographic memory, a molecular electronics memory, or an insulator resistance change memory.

The memory device 200 may include a memory cell array MCA, the memory cell array MCA may include a plurality of memory blocks BLK1 to BLKz, and a memory block BLK1 May include a plurality of pages PG1 to PGk. Here, z and k may be positive integers, respectively, and may vary according to example embodiments. In one example embodiment, a memory block may be an erase unit, and a page may be a write/read unit.

Memory cells of the memory blocks BLK1 to BLKz may be connected to cell strings, word lines, and bit lines constituting the memory cell array MCA. One or more bits may be written to each memory cell. For example, each memory cell may be a single-level cell (SLC), a multi-level cell (MLC), a triple-level cell (TLC), or a quad-level cell (QLC). Hereinafter, it is assumed that each memory cell is an SLC for convenience of explanation.

The memory controller 100 may perform a control operation regarding the memory device 200. For example, the memory controller 100 may control the memory device 200 to write data DATA to the memory device 200 according to a write request from a host or to read data DATA from memory device 200 according to a read request from the host. For example, the memory controller 100 may control the memory device 200 to write data DATA by transmitting a command CMD, an address ADDR, and the data DATA to the memory device 200 through an input/output line. In another example, the memory controller 100 may control the memory device 200 to read data DATA by transmitting a command CMD and an address ADDR to the memory device 200 through the input/output line.

The memory controller 100 may include a data write module 110 that provides a function related to a data write operation. The data write module 110 may perform a data write operation with enhanced security. In an example embodiment, the data write module 110 may write data DATA to the memory device 200 and additionally write dummy data DUMMY DATA for security to the memory device 200.

Here, the data DATA is data that needs security and may include various types of information like user data, user information, information regarding the memory system 10, security key information, etc. The data DATA may be received from the host or may be generated during an operation of the memory system 10. The dummy data DUMMY DATA is not valid actual data but data that exists only nominally. The dummy data DUMMY DATA may be generated by the data write module 110. Hereinafter, a write operation with enhanced security of the data write module 110 will be described in detail.

First, the data write module 110 may write data DATA by splitting the data DATA and distributing split data DATA in one storage region of the memory device 200. For example, the data write module 110 may randomly split the data DATA, randomly select some of a plurality of memory cells included in one storage region of the memory device 200, and write split data DATA in the selected memory cells.

Here, one storage region of the memory device 200 may be a region set to store security data, but example embodiments are not limited thereto. For example, the data write module 110 may select one of a plurality of storage regions of the memory device 200 every time a write operation with enhanced security is performed. A unit of one storage region of the memory device 200 may be a memory cell, a page, a block, a plane, a die, a chip, etc. Also, the data write module 110 may store address information corresponding to storage locations of respective split data DATA. A method in which the data write module 110 writes by distributing the data DATA is not limited to the above-described example, and the data write module 110 may write the data DATA by distributing the data DATA in various ways. As described above, the data write module 110 may distribute the data DATA in the memory device 200, thereby making it more difficult for an unauthorized user to identify the data DATA.

Also, the data write module 110 may write the dummy data DUMMY DATA to memory cells adjacent to or non-adjacent to memory cells in which the split data DATA is written. In one example embodiment, the data write module 110 may write the split data DATA to first memory cells and write the dummy data DUMMY DATA to other memory cells included in at least one first cell string (i.e., memory cells included in the first cell string in which the split data DATA is not written) and/or memory cells included in a second cell string adjacent to the first cell string.

In one example embodiment, the data write module 110 may randomly generate the dummy data DUMMY DATA. However, example embodiments are not limited thereto, and the data write module 110 may generate the dummy data DUMMY DATA based on a charge amount related to the first memory cells in which the split data DATA is written.

In detail, the data write module 110 may calculate the charge amount of the at least one first cell string including each of the first memory cells and calculate a charge amount of the second cell string adjacent to the first cell string. A charge amount of a cell string may be calculated based on values of data written to memory cells connected to the corresponding cell string.

For example, data of "0" or "1" may be written to a memory cell that is an SLC, and a memory cell to which data "1" is written may have a larger charge amount than a memory cell to which data "0" is written. In another example, data of "00", "01", "10", or "11" may be written to a memory cell that is an MLC, wherein charge amounts of memory cells to which data is written may increase in the order of data of "00", "01", "10", and "11". In the same regard, a TLC memory cell or a QLC memory cell may have different charge amounts according to values of data written thereto. Therefore, the data write module 110 may calculate a charge amount of each cell string by using values of data of memory cells connected to the corresponding cell string.

Also, based on a result of the calculation of the charge amount, the data write module 110 may generate dummy data DUMMY DATA that makes a ratio between the final charge amount of the first cell string and the final charge amount of the second cell string correspond to (be substantially the same as) a pre-set ratio after the dummy data DUMMY DATA is written. For example, the pre-set ratio may be 1:1 or a similar ratio. However, example embodiments are not limited thereto, and various ratios may be applied.

For example, the data write module 110 may generate dummy data DUMMY DATA that makes a ratio between the final charge amount of the first cell string and the final charge amount of the second cell string 1:1 (that is, the final charge amounts are the same) after the dummy data DUMMY DATA is written. When the dummy data DUMMY DATA as described above is written, similar data (but data that is practically meaningless) exists around distributed data DATA, and thus it may be difficult for an unauthorized user to identify data DATA having an actual meaning. As described above, the data write module 110 may additionally write the dummy data DUMMY DATA in a region adjacent to or non-adjacent to the storage region in which the split data DATA is written, thereby making it more difficult for an unauthorized user to identify the data DATA. Detailed descriptions of the operation in which the data write module 110 calculates dummy data will be given later with reference to FIGS. 7 and 8.

In the above-described example, the data write module 110 calculates or writes dummy data based on a "cell string" including a memory cell in which the data DATA is written, but example embodiments are not limited thereto. For example, in a modified example embodiment, the data write module 110 may calculate or write dummy data based on a "word line" including a memory cell in which the data DATA is written. In detail, the data write module 110 may calculate a charge amount of a first word line including first memory cells in which the data DATA is written, calculate a charge amount of a second word line adjacent to the first word line, and generate the dummy data DUMMY DATA based on results of the calculations. Also, the data write module 110 may write the dummy data DUMMY DATA to other memory cells included in the first word line (i.e., memory cells included in the first word line in which the data DATA is not written) and/or memory cells included in the second word line.

For example, in another modified example embodiment, the data write module 110 may calculate or write dummy data based on a "bit line" including a memory cell in which the data DATA is written. In detail, the data write module 110 may calculate a charge amount of a first bit line including first memory cells in which the data DATA is written, calculate a charge amount of a second bit line adjacent to the first bit line, and generate the dummy data DUMMY DATA based on results of the calculations. Also, the data write module 110 may write the dummy data DUMMY DATA to other memory cells included in the first bit line (i.e., memory cells included in the first bit line in which the data DATA is not written) and/or memory cells included in the second bit line.

The data write module 110 may be implemented in various forms and provided in the memory controller 100. For example, the data write module 110 may be implemented as hardware HW like a circuit. Alternatively, the data write module 110 may be implemented as software SW including a program and perform various processes related to a data write operation as a processing unit executes the data write module 110 loaded to an operation memory. Alternatively, the data write module 110 may be implemented as a combination of hardware HW and software SW. Furthermore, although FIG. 1 shows that the data write module 110 is included in the memory controller 100, example embodiments are not limited thereto. For example, the data write module 110 may be provided outside the memory controller 100 within the memory system 10.

The memory system 10 may split data DATA that needs security and write split data DATA to distributed memory cells, thereby enhancing security. Furthermore, the memory system 10 may further enhance security by writing dummy data DUMMY DATA to memory cells adjacent to or non-adjacent to the memory cells to which the split data DATA is written.

Hereinafter, for convenience of explanation, data that needs security will be referred to as security data, and memory cells to which the security data is written will be referred to as first memory cells.

Figure 2:
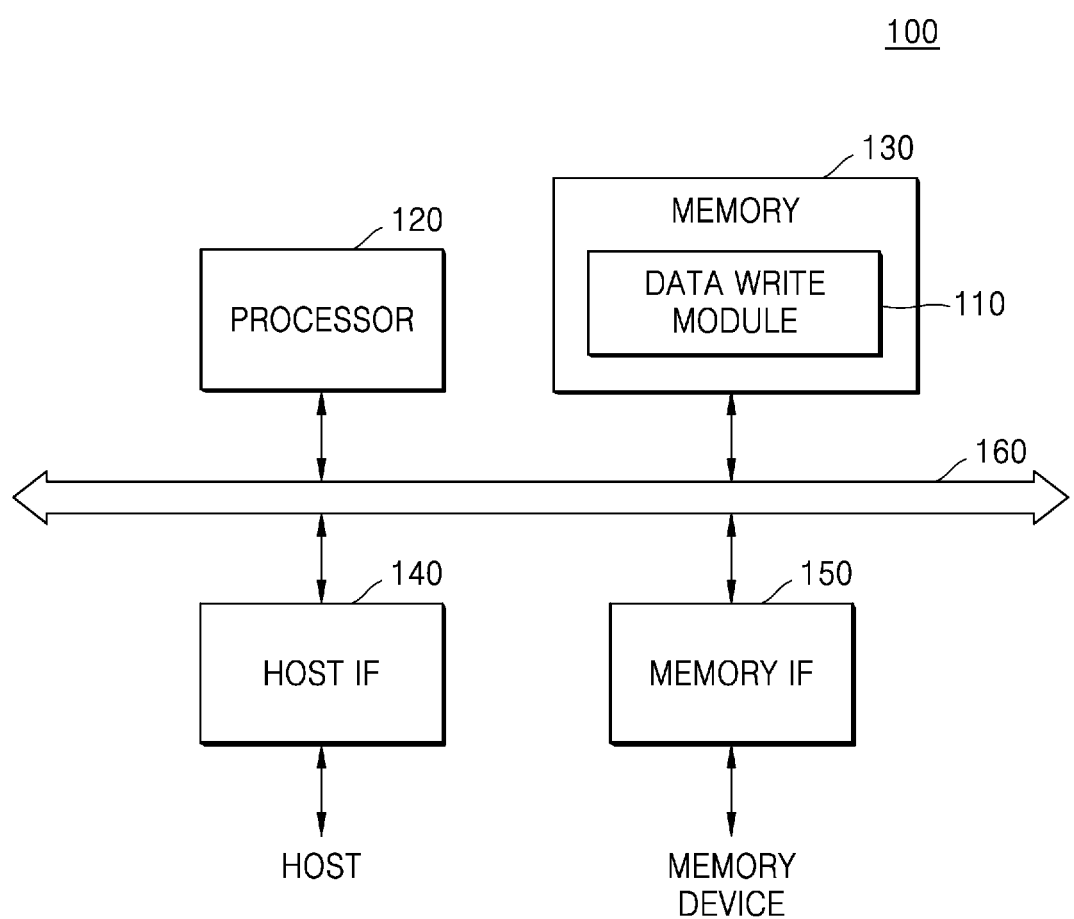
FIG. 2 is a block diagram of a memory controller according to an example embodiment.

FIG. 2 is a block diagram showing a memory controller 100 according to an example embodiment. In detail, FIG. 2 is a block diagram showing the memory controller 100 of FIG. 1.

Referring to FIGS. 1 and 2, the memory controller 100 may include a processor 120, a memory 130, a host interface 140, a memory interface 150, and a bus 160. Also, the memory 130 may include a data write module 110. The data write module 110 may correspond to the data write module 110 of FIG. 1.

The processor 120 may include a central processing unit (CPU) or a microprocessor and may control the overall operation of the memory controller 100 by executing instructions stored in the memory 130. Although FIG. 2 shows one processor 120, the memory controller 100 may include a plurality of processors 120 according to example embodiments.

The memory 130 may operate under the control of the processor 120 and may be used as an operation memory, a buffer memory, a cache memory, etc. The memory 130 may be implemented with a volatile memory like a DRAM or an SRAM or may be implemented with a non-volatile memory like a PRAM or a flash memory. Also, a plurality of memories 130 may be provided.

The data write module 110 may be implemented as firmware or software and may be loaded to the memory 130. Although FIG. 2 shows that the data write module 110 is loaded into the memory 130, example embodiments are not limited thereto. For example, the data write module 110 may be loaded to the memory 130 outside the memory controller 100 or may be provided inside or outside the memory controller 100 as a separate hardware component.

The host interface 140 may communicate with a host HOST through various interfaces. In an example embodiment, the host interface 112 may communicate with the host HOST through various interfaces including a universal serial bus (USB), a multimedia card (MMC), a PCI Express (PCI-E), an AT attachment (ATA), a serial AT attachment (SATA), a parallel AT attachment (PATA), a small calculator system interface (SCSI), a serial attached SCSI (SAS), an enhanced small disk interface (ESDI), and an integrated drive electronics (IDE). Also, a non-volatile memory express (NVMe) has been proposed as an interface optimized for a memory system like an SSD, and an NVMe interface may be applied to the host interface 140. According to an example embodiment, the host interface 140 may receive a write request and data DATA that needs security from the host HOST.

The memory interface 150 may provide a channel between the memory controller 100 and the memory device 200. For example, a command CMD, an address ADDR and data DATA may be transmitted and received between the memory controller 100 and the memory device 200 through the memory interface 150.

Communication between the memory controller 100, processor 120, memory 130, host interface 140 and memory interface may be performed through the bus 160.

Figure 3:
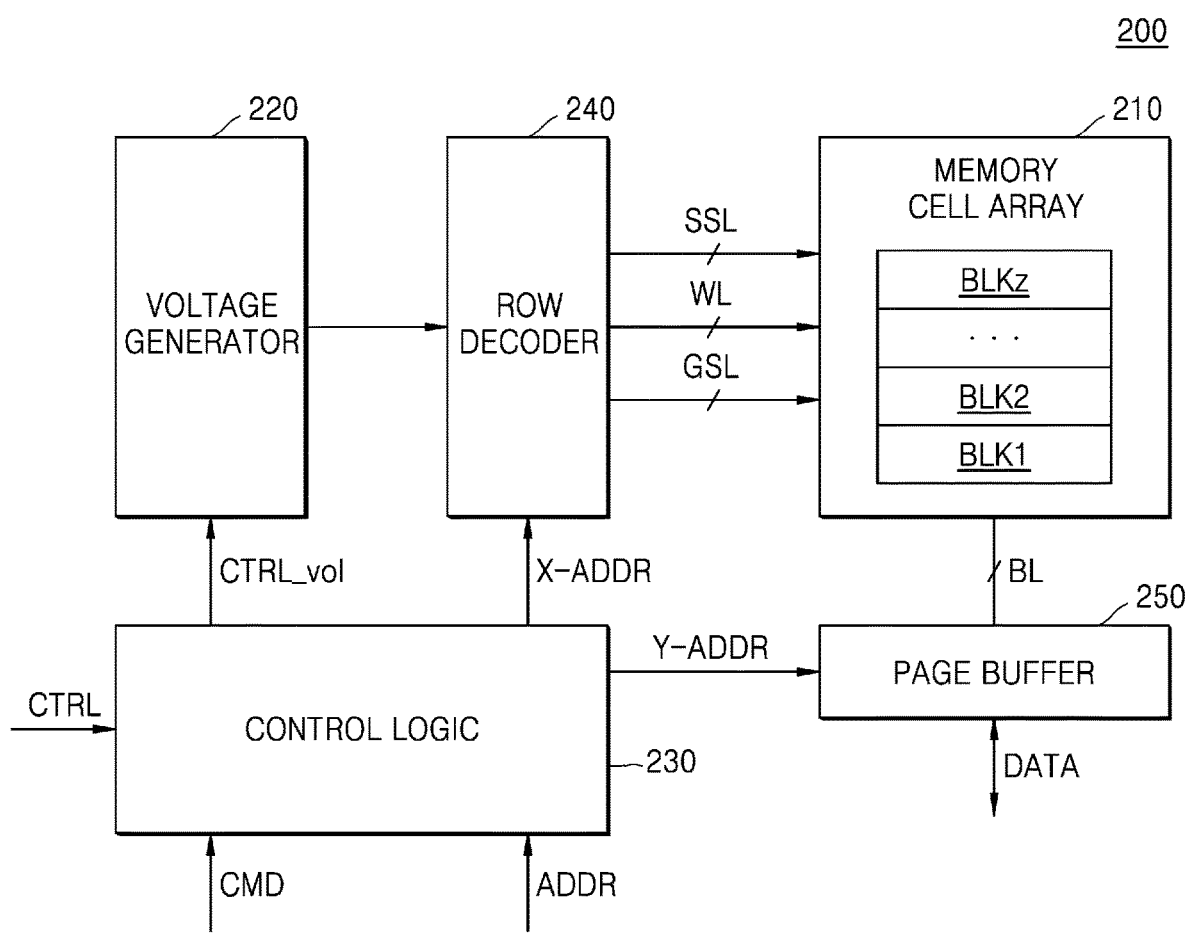
FIG. 3 is a block diagram showing an example of a memory device according to an example embodiment.

FIG. 3 is a block diagram showing an example implementation of a memory device 200 according to an example embodiment. In detail, FIG. 3 is a block diagram showing the memory device 200 of FIG. 1.

Referring to FIG. 3, the memory device 200 may include a memory cell array 210, a voltage generator 220, a control logic 230, a row decoder 240, and a page buffer 250. Although not shown in FIG. 3, the memory device 200 may further include various other components related to a memory operation, e.g., a data input/output circuit, an input/output interface or a bus.

The memory cell array 210 includes a plurality of memory blocks BLK1 to BLKz, and memory cells of the memory blocks BLK1 to BLKz may be connected to word lines WL, string select lines SSL, ground select lines GSL, and bit lines BL. The memory cell array 210 may be connected to the row decoder 240 through the word lines WL, the string select lines SSL, and the ground select lines GSL and may be connected to the page buffer 250 through the bit lines BL.

The control logic 230 may output various internal control signals for writing data to the memory cell array 210 or reading data from the memory cell array 210 based on a command CMD, an address ADDR, and a control signal CTRL received from the memory controller 100. For example, the control logic 230 may provide a row address X-ADDR and a column address Y-ADDR corresponding to a storage location of the data DATA to the row decoder 240 and the page buffer 250, respectively, and a control voltage CTRL_vol, to the voltage generator 220.

Figure 4:
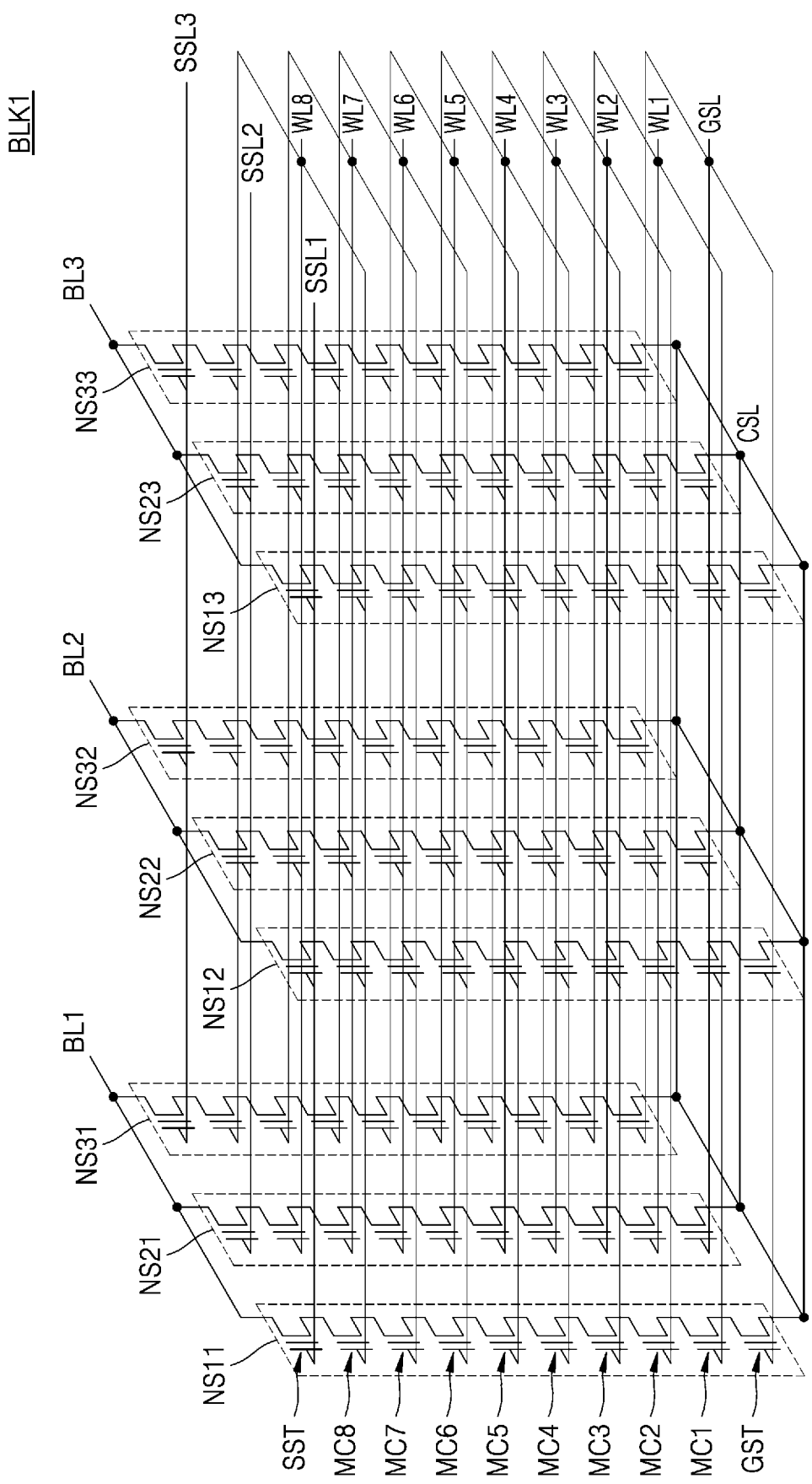
FIG. 4 is a circuit diagram of a memory block included in a memory cell array according to an example embodiment.

FIG. 4 is a circuit diagram showing a memory block included in the memory cell array 210 according to an example embodiment. In detail, FIG. 4 is a circuit diagram showing a memory block BLK1 included in the memory cell array 210 of FIG. 3.

Referring to FIGS. 3 and 4, the memory cell array 210 may be a memory cell array of vertical NAND flash memories and may include a plurality of memory blocks. Each memory block BLK1 may include a plurality of NAND cell strings NS11 to NS33, a plurality of word lines WL1 to WL8, a plurality of bit lines BL1 to BL3, a plurality of ground select lines GSL1 to GSL3, a plurality of cell string select lines SSL1 to SSL3, and a common source line CSL. Here, the number of NAND cell strings, the number of word lines, the number of bit lines, the number of ground selection lines, and the number of cell string selection lines may vary according to example embodiments.

NAND cell strings NS11, NS21, and NS31 are provided between a first bit line BL1 and the common source line CSL, NAND cell strings NS12, NS22, and NS32 are provided between a second bit line BL2 and the common source line CSL, and NAND cell strings NS13, NS23, and NS33 are provided between a third bit line BL3 and the common source line CSL. Each NAND cell string (e.g., NS11) may include a cell string select transistor SST, a plurality of memory cells MC1 to MC8, and a ground select transistor GST that are coupled in series.

NAND cell strings commonly coupled to one bit line constitute one column. For example, the NAND cell strings NS11, NS21, and NS31 commonly coupled to the first bit line BL1 may correspond to a first column, the NAND cell strings NS12, NS22, and NS32 commonly coupled to the second bit line BL2 may correspond to as second column, and the NAND cell strings NS13, NS23, and NS33 commonly coupled to the third bit line BL3 may correspond to a third column.

NAND cell strings coupled to one cell string selection line constitute one row. For example, NAND cell strings NS11, NS12, and NS13 coupled to a first cell string selection line SSL1 may correspond to a first row, NAND cell strings NS21, NS22, and NS23 coupled to a second cell string selection line SSL2 may correspond to a second row, and NAND cell strings NS31, NS32, and NS33 coupled to a third cell string selection line SSL3 may correspond to a third row.

The cell string select transistor SST is coupled to a corresponding string select line SSL1 to SSL3. The memory cells MC1 to MC8 are coupled to corresponding word lines WL1 to WL8, respectively. The ground select transistor GST is coupled to a corresponding ground select line GSL1 to GSL3. The cell string select transistors SST are respectively coupled to a corresponding bit line BL1 to BL3, and the ground select transistor GST is coupled to the common source line CSL.

Word lines of the same height (e.g., WL1) are coupled to each other in common, the cell string selection lines SSL1 to SSL3 are separated from one another, and the ground selection lines GSL1 to GSL3 are also separated from one another. For example, when programming memory cells coupled to a first word line WL1 and belonging to the NAND cell strings NS11, NS12, and NS13, the first word line WL1 and the first cell string selection line SSL1 are selected. The ground selection lines GSL1 to GSL3 may be coupled to one another in common.

The memory system 10 of FIG. 1 according to an example embodiment may store data DATA and dummy data DUMMY DATA in regions adjacent or non-adjacent to each other within the memory cell array 210. For example, security data may be stored in an eighth memory cell MC8 connected to an eighth word line WL8 of a NAND cell string NS13 of the memory block BLK1, and dummy data may be stored in an eighth memory cell MC8 connected to an eighth word line WL8 of a NAND cell string NS23 adjacent to the NAND cell string NS13.

Figure 5:
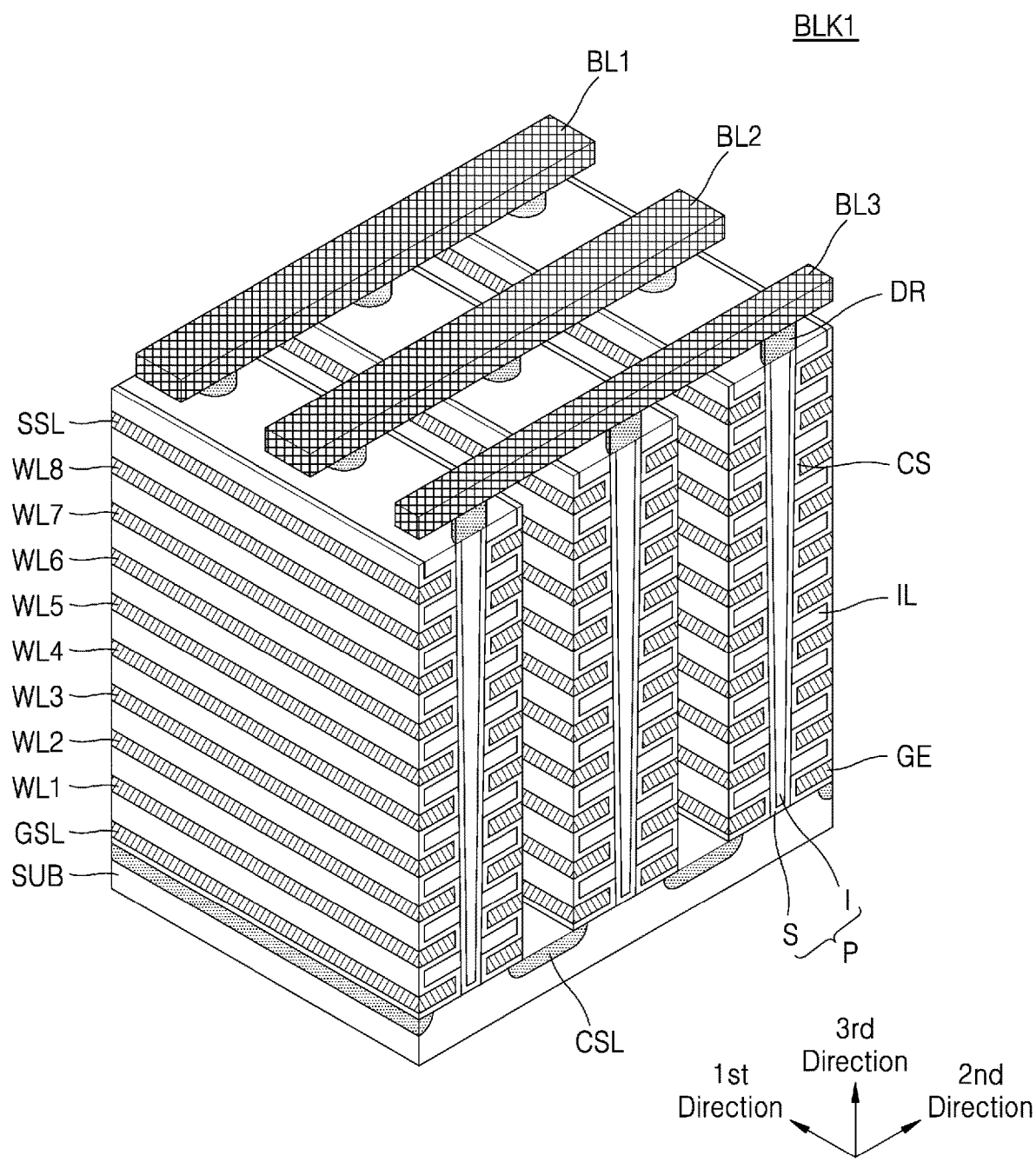
FIG. 5 is a perspective view of a memory block of FIG. 4 according to an example embodiment.

FIG. 5 is a perspective view of a memory block of FIG. 4.

Referring to FIGS. 4 and 5, memory blocks included in the memory cell array 210 are formed in a vertical direction with respect to a substrate SUB. Although FIG. 5 shows that the memory block includes two selection lines GSL and SSL, eight word lines WL1 to WL8, and three bit lines BL1 to BL3, actual numbers may be less than or greater than the above numbers.

The substrate SUB has a first conductivity type (e.g., p type), and common source lines CSL that extend in a first direction (e.g., the Y direction) and are doped with impurities of a second conductivity type (e.g., n type) are provided in the substrate SUB. A plurality of insulation films IL extending in the first direction are sequentially provided in a third direction (e.g., the Z direction) on a region of the substrate SUB between two adjacent common source lines CSL, and the insulation films IL are a certain distance apart from each other in the third direction. For example, the insulation films IL may include an insulating material like silicon oxide.

A plurality of pillars P, which are sequentially arranged in the first direction and penetrate through the insulation films IL in the third direction, are provided on the region of the substrate SUB between two adjacent common source lines CSL. For example, the pillars P will contact the substrate SUB by penetrating through the insulation films IL. In detail, a surface layer S of each pillar P may include a silicon-based material doped with impurities of the first conductivity type and function as a channel region. On the other hand, an internal layer I of each pillar P may include an insulating material like silicon oxide or an air gap.

A charge storage layer CS is provided along exposed surfaces of the insulation films IL, the pillars P, and the substrate SUB in the region between the two adjacent common source lines CSL. The charge storage layer CS may include a gate insulation layer (also referred to as a 'tunneling insulation layer'), a charge trapping layer, and a blocking insulation layer. For example, the charge storage layer CS may have an oxide-nitride-oxide (ONO) structure. Also, gate electrodes GE like selected gate lines GSL and SSL and the word lines WL1 through WL8 is provided on an exposed surface of the charge storage layer CS in the region between the two adjacent common source lines CSL.

Drains or drain contacts DR are provided on the pillars P, respectively. For example, the drains or the drain contacts DR may include a silicon-based material doped with impurities of the second conductivity type. Bit lines BL1 to BL3 extending in a second direction (e.g., the X direction) and being a certain distance apart from one another in the first direction are provided on the drains.

Figure 6A:
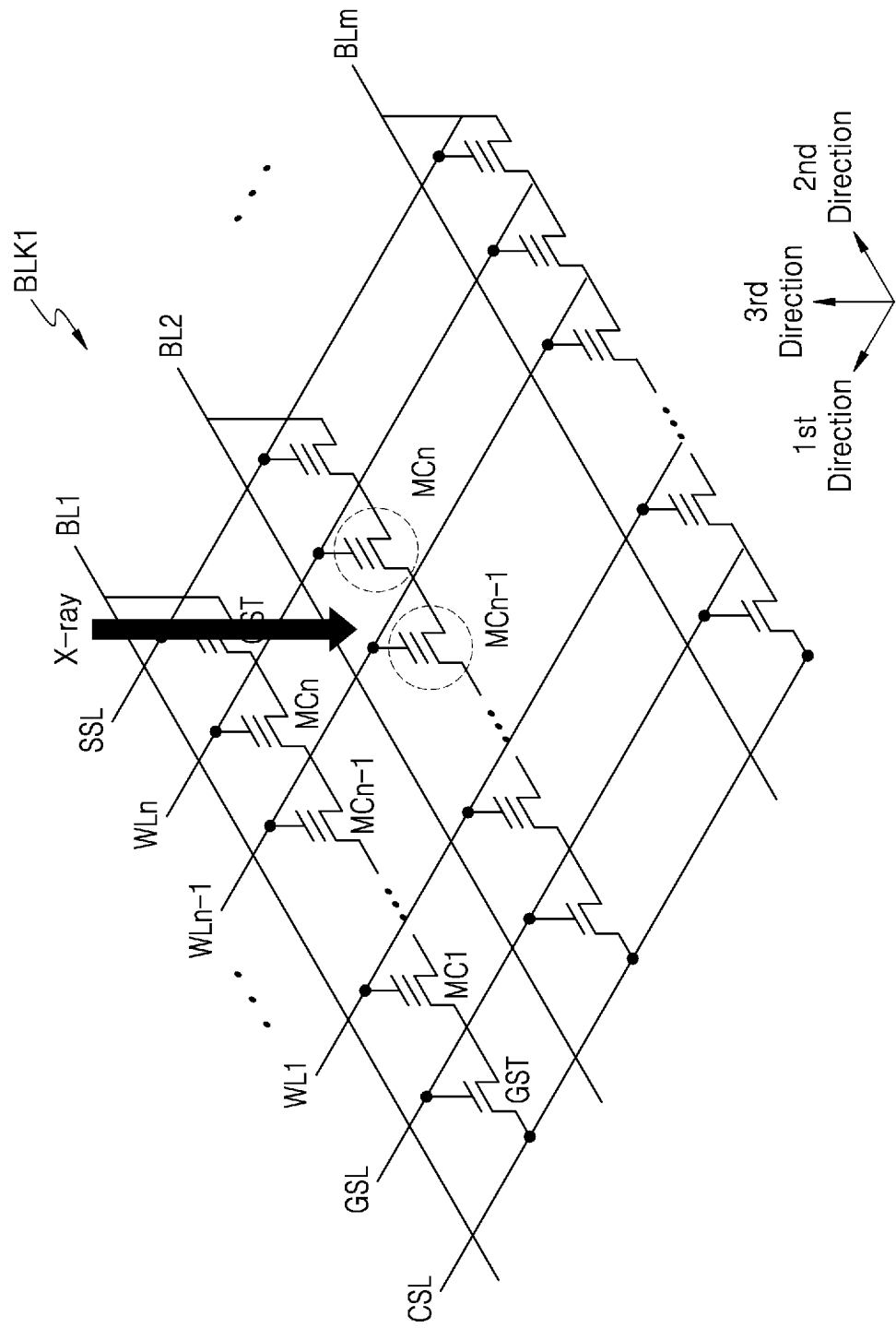
FIG. 6A is a diagram showing a method of measuring a charge amount by using an X-ray according to an example embodiment.
Figure 6B:
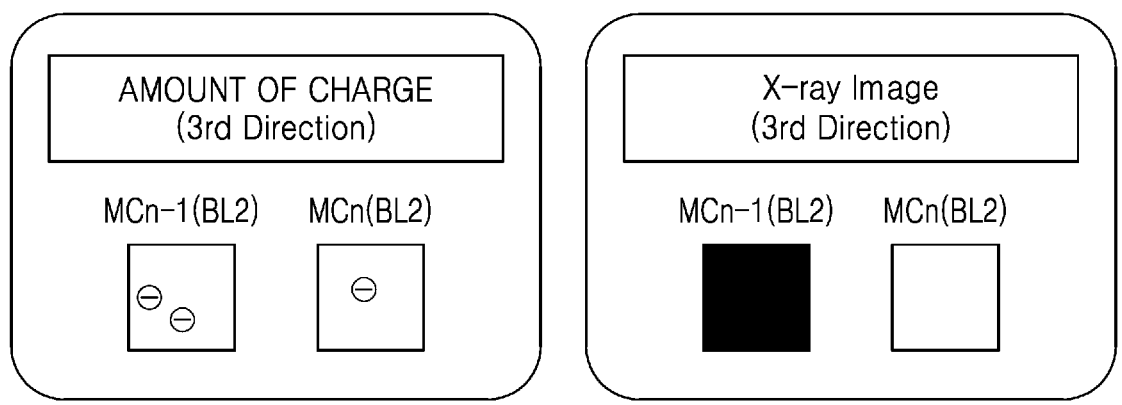
FIG. 6B is a diagram showing an X-ray image according to an example embodiment.

FIG. 6A is a diagram showing a method of measuring a charge amount by using an X-ray according to an example embodiment, and FIG. 6B is a diagram showing an X-ray image according to an example embodiment. In FIGS. 6A and 6B, for easier understanding, a method of measuring a charge amount by using an X-ray and an X-ray image regarding the memory block BLK1 of a 2-dimensional semiconductor (or planar semiconductor) will be described. Also, it is assumed that memory cells connected to the memory block BLK1 are SLCs.

Referring to FIG. 6A, the memory block BLK1 may include word lines WL1 to WLn extending in the first direction (e.g., the Y direction), and bit lines BL1 to BLm extending in the second direction (e.g., the X direction). Furthermore, memory cells MC1 to MCn−1 may be respectively connected to points where the word lines WL1 to WLn cross the bit lines BL1 to BLm.

The memory cells MC1 to MCn−1 of each bit line included in the memory block BLK1 may each have a charge amount corresponding to a value of data stored therein. Also, a charge amount of an imaging target may be measured by using an X-ray image. Therefore, when X-ray imaging is performed on the memory block BLK1 in the third direction (e.g., the Z direction), respective charge amounts of the memory cells MC1 to MCn−1 may be measured. Hereinafter, for convenience of explanation, it is assumed that the charge amount of a memory cell to which data "1" is written has a value of 2 and the charge amount of a memory cell to which data "0" is written has a value of 1. However, the above assumption is merely an example to help understanding and does not limit that the charge amount of a memory cell having data "1" and the charge amount of a memory cell having data "0" have a multiple relationship.

Referring to FIG. 6A, an n-lth memory cell MCn−1 connected to a second bit line BL2 of the memory block BLK1 may be a memory cell to which data "1" is written, and an nth memory cell MCn may be a memory cell to which data "0" is written. Therefore, referring to FIG. 6B, when viewed in the third direction, the charge amount of the n-lth memory cell MCn−1 may have a value of 2, and the charge amount of the nth memory cell MCn may have a value of 1. Also, X-ray imaging may be performed on two memory cells MCn−1 and MCn in the third direction.

An X-ray image becomes darker as the charge amount of an imaging target increases. Therefore, referring to FIG. 6B, an X-ray image of the n-lth memory cell MCn−1 of the second bit line BL2 taken in the third direction may have a darker color than an X-ray image of the nth memory cell MCn of the second bit line BL2 taken in the third direction. In this way, by using the X-ray image, a charge amount of each memory cell may be measured, and a data value corresponding to a measured charge amount may be inferred.

Although FIGS. FIGS. 6A and 6B show a method of measuring a charge amount of a memory block of a 2-dimensional semiconductor by using X-ray, a charge amount of a memory block of a 3-dimensional semiconductor may also be measured through X-ray imaging.

In detail, the memory block BLK1 of FIG. 5 may include a plurality of cell strings extending in the third direction (e.g., the Z direction). Also, when X-ray imaging is performed on memory cells arranged in a row, an X-ray image may represent an image in which charge amounts of the memory cells are accumulated. Therefore, when X-ray imaging is performed in the third direction (e.g., the Z direction) on the memory block BLK1 of FIG. 5, an X-ray image may represent an image in which charge amounts of memory cells connected to each cell string are accumulated. Therefore, when X-ray imaging is performed on a memory block of a 3-dimensional semiconductor, the charge amount of each cell string may be measured.

As described above, by using an X-ray image, charge amounts of memory cells of a 2-dimensional semiconductor may be measured or charge amounts of a cell string of a 3-dimensional semiconductor may be measured. Because a charge amount and a data value are related to each other, a data value of a memory cell may be inferred by using an X-ray image.

To prevent data values of memory cells from being inferred by using an X-ray image, the data write module 110 of FIG. 1 may distribute and store data that needs security (security data) to the first memory cells and write dummy data to memory cells adjacent or non-adjacent to the first memory cells to which security data is written. In particular, the data write module 110 of FIG. 1 may generate dummy data that makes charge amounts of cell strings of a semiconductor memory to be identical to one another and write generated dummy data to adjacent or non-adjacent memory cells, thereby making X-ray images of the cell strings identical to one another and preventing data values from being inferred from the X-ray images.

Figure 7:
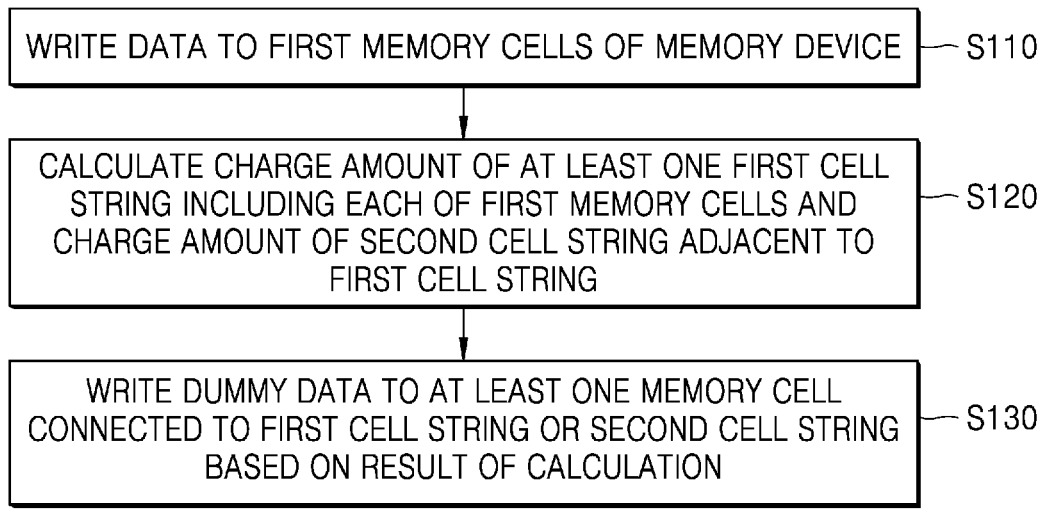
FIG. 7 is a flowchart of an operating method of a memory system according to an example embodiment.

FIG. 7 is a flowchart of a method of operating a memory system according to an example embodiment. In detail, FIG. 7 is a flowchart of a method of operating the memory system 10 of FIG. 1. At least some of operations constituting the method shown in FIG. 7 may be performed by the memory controller 100 of the memory system 10.

Referring to FIGS. 1 and 7, the memory system 10 may write data, such as security data that needs security, to first memory cells of the memory device 200 (operation S110). In detail, the memory system 10 may split security data that needs security and distribute split security data in one storage region of the memory device 200. For example, the data write module 110 may randomly split the security data, randomly select first memory cells from among a plurality of memory cells included in one storage region of the memory device 200, and write split security data to the selected first memory cells.

Also, the memory system 10 may calculate a charge amount of at least one first cell string including each of the first memory cells and a charge amount of the second cell string adjacent to the first cell string. A charge amount of a cell string may be calculated based on values of data written to memory cells connected to the corresponding cell string.

Figure 8:
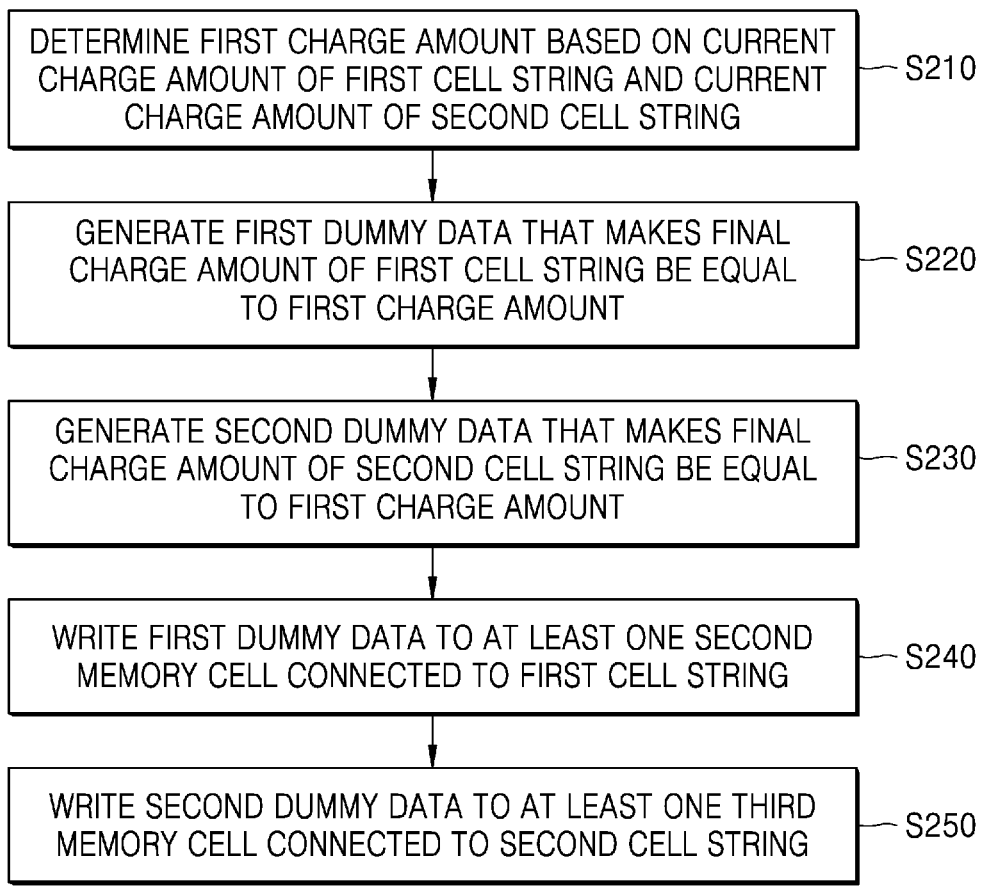
FIG. 8 is a flowchart showing an operation for generating and writing dummy data according to an example embodiment.

Furthermore, the memory system 10 may write dummy data to at least one memory cell connected to the first cell string or the second cell string based on a result of the calculation (operation S130). In detail, based on a result of the calculation, the memory system 10 may generate dummy data that makes a ratio between the final charge amount of the first cell string and the final charge amount of the second cell string correspond to a pre-set ratio after the dummy data is written. For example, the pre-set ratio may be 1:1 or a similar ratio, but example embodiments are not limited thereto. Furthermore, the memory system 10 may write generated dummy data to at least one memory cell connected to the first cell string or the second cell string. In FIG. 8 below, a specific example embodiment in which the pre-set ratio is 1:1 will be described.

FIG. 8 is a flowchart showing an operation for generating and writing dummy data according to an example embodiment. In detail, FIG. 8 is a diagram showing a detailed operation of operation S130 of FIG. 7. FIG. 8 shows an example embodiment for generating dummy data such that a pre-set ratio between the final charge amount of a first cell string and the final charge amount of a second cell string is 1:1.

Referring to FIGS. 1, 7 and 8, the memory system 10 may determine a first charge amount, which is a basis for generating dummy data, based on a current charge amount of the first cell string and a current charge amount of the second cell string (operation S210). In detail, after security data is written to first memory cells, the memory system 10 may determine the first charge amount based on the charge amount of the first cell string and the charge amount of the second cell string. In one example embodiment, the first charge amount may be determined based on the larger one from between the current charge amount of the first cell string and the current charge amount of the second cell string. When dummy data is written, the charge amount of a cell string is maintained (e.g., when the dummy data is "0") or increases, and thus the first charge amount may be determined as a value equal to or greater than the largest charge amount. For example, when the current charge amount of the first cell string has a value of 4 and the current charge amount of the second cell string has a value of 2, the memory system 10 may determine a value equal to or greater than 4 as the first charge amount.

Next, the memory system 10 may generate first dummy data that makes the final charge amount of the first cell string correspond to (be substantially the same as) the first charge amount (operation S220). In detail, the memory system 10 may calculate a difference between the current charge amount of the first cell string and the first charge amount, and may generate first dummy data corresponding to the calculated difference.

For example, when the current charge amount of the first cell string has a value of 10 and the first charge amount is determined to be a value of 12, the memory system 10 may generate first dummy data that may increase the charge amount of the first cell string by 2. In another example, when the current charge amount of the first cell string has a value of 8 and the first charge amount is also determined as a value of 8, it is not necessary to write dummy data to the first cell string, and thus the memory system 10 may omit the operation for generating the first dummy data.

Next, the memory system 10 may generate second dummy data that makes the final charge amount of the second cell string correspond to (be substantially the same as) the first charge amount (operation S230). In detail, the memory system 10 may calculate a difference between the current charge amount of the second cell string and the first charge amount and may generate second dummy data corresponding to the calculated difference. For example, when the current charge amount of the second cell string has a value of 8 and the first charge amount is determined to be a value of 10, the memory system 10 may generate second dummy data that may increase the charge amount of the second cell string by 2.

Also, the memory system 10 may write the first dummy data to at least one of second memory cells connected to the first cell string (operation S240). In detail, the memory system 10 may write the first dummy data to remaining second memory cells other than the first memory cells to which the security data is written, from among all memory cells connected to the first cell string.

Also, the memory system 10 may write the second dummy data to at least one third memory cell connected to the second cell string (operation S250). In detail, the memory system 10 may write the second dummy data to the at least one third memory cell from among all memory cells connected to the second cell string. The at least one third memory cell may correspond to memory cells connected to the second cell string other than the first memory cells to which the security data is written, from among all memory cells connected to the second cell string. Operations S240 and S250 may be omitted when it is determined in operations S220 and S230 that it is not necessary to write dummy data.

The order of operations in the flowchart of FIG. 8 is merely an example, and the order of operations S220 and S230 and the order of operations S240 and S250 may be changed.

Figure 9A:
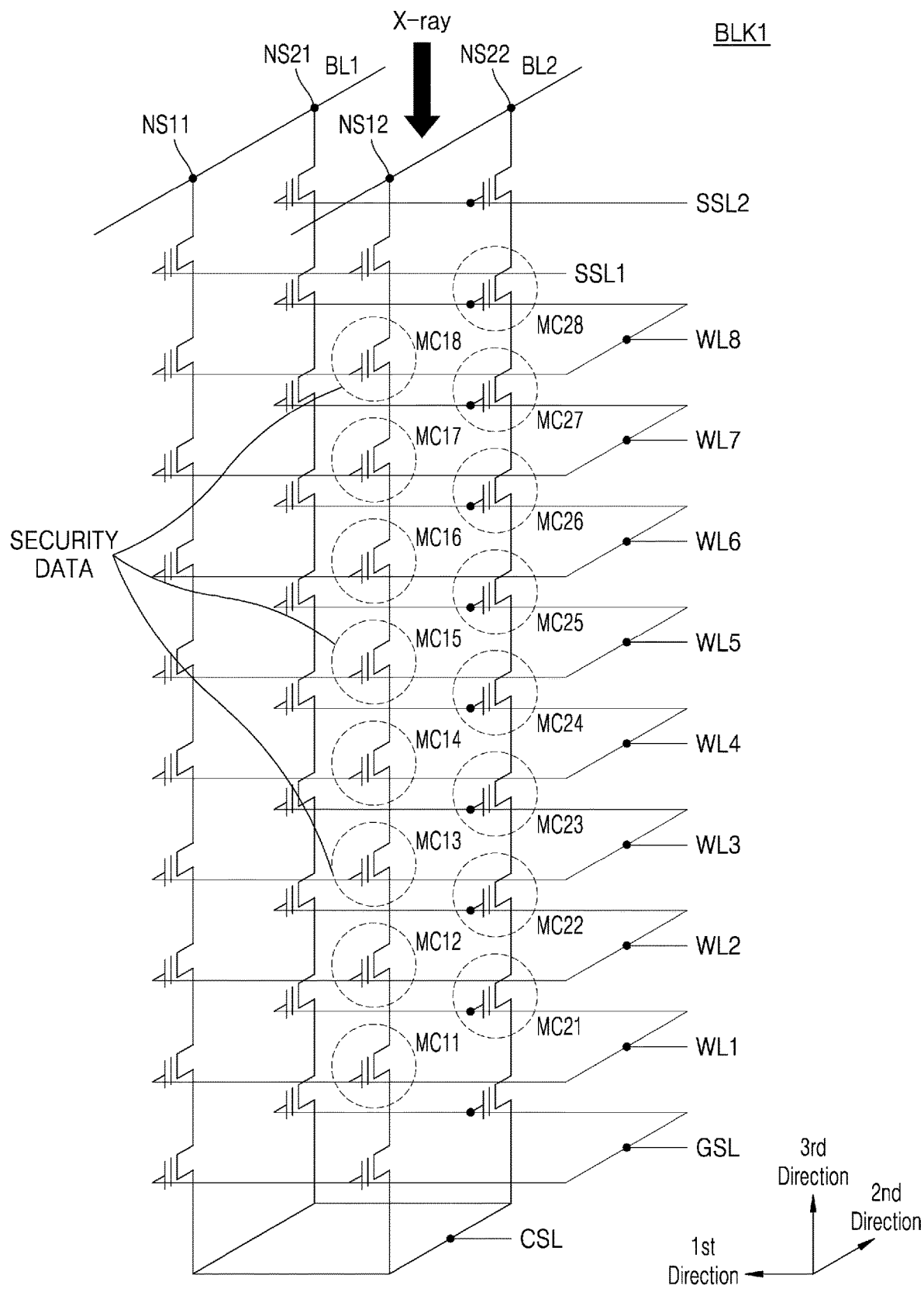
FIG. 9A is a diagram showing an X-ray imaging operation of a memory block according to an example embodiment.
Figure 9B:
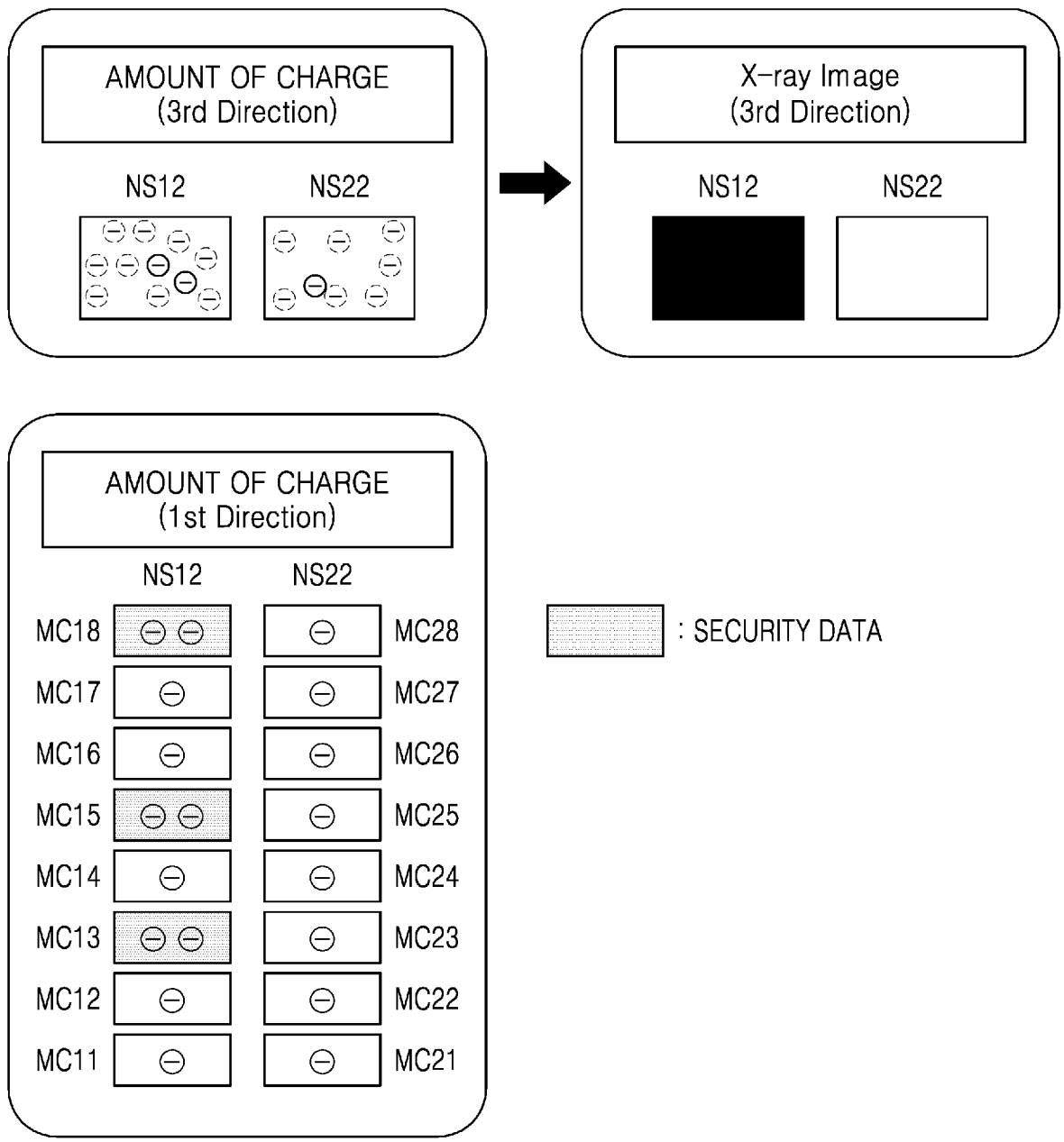
FIG. 9B is a diagram showing an X-ray image after security data is written according to an example embodiment.
Figure 9C:
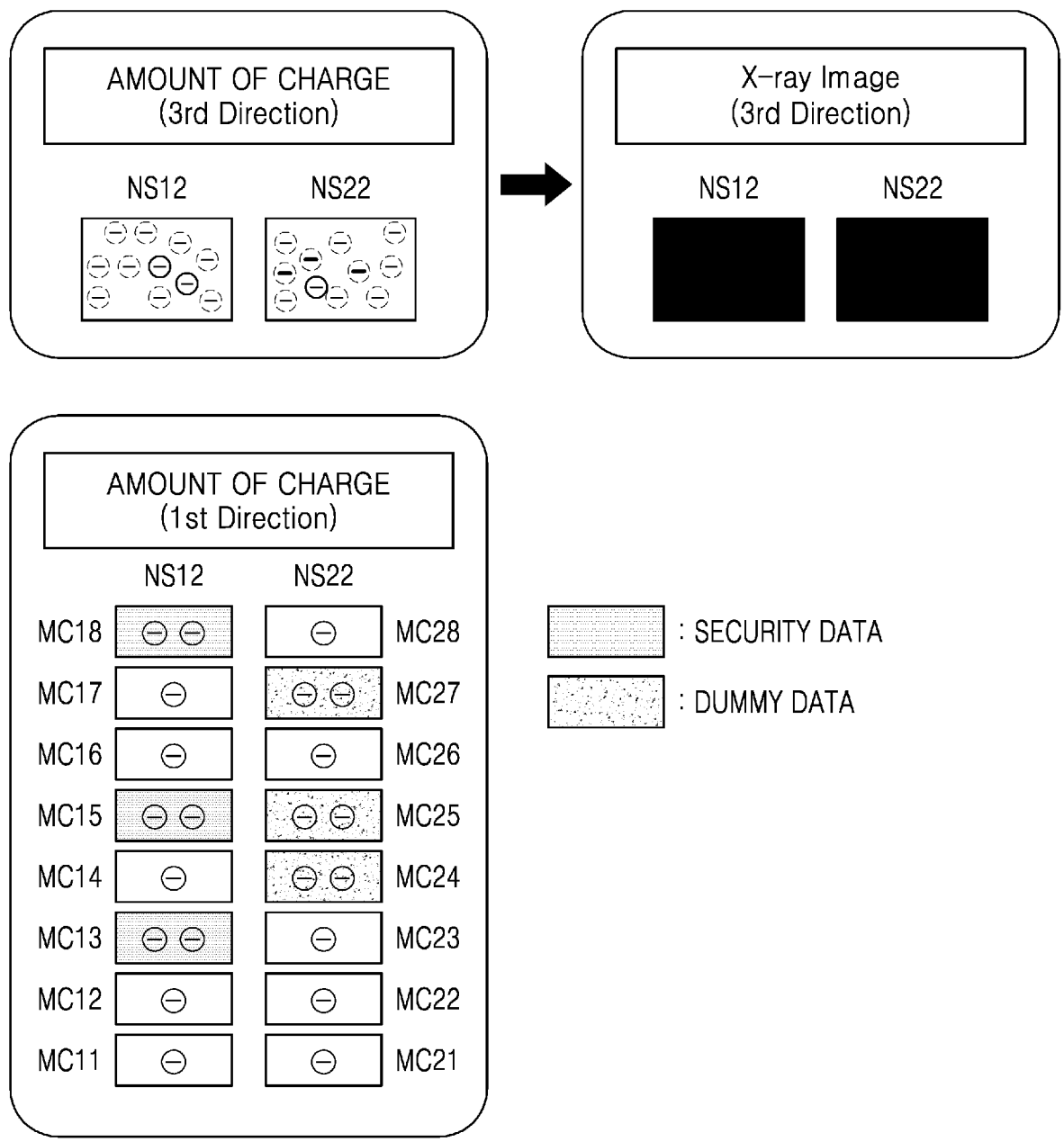
FIG. 9C is a diagram showing an X-ray image after dummy data is written according to an example embodiment.

FIG. 9A is a diagram showing an X-ray imaging operation of a memory block according to an example embodiment, FIG. 9B is a diagram showing an X-ray image after security data is written according to an example embodiment, and FIG. 9C is a diagram showing an X-ray image after dummy data is written according to an example embodiment.

FIG. 9A shows cell strings NS11 and NS21 connected to a first bit line BL1 and cell strings NS12 and NS22 connected to a second bit line BL2 in memory cell arrays of the memory block BLK1. Referring to FIG. 9A, the memory system 10 of FIG. 1 may split security data that needs security and store split security data in memory cells MC13, MC15, and MC18 connected to a cell string NS12. Next, the memory system 10 may determine to write dummy data to the cell string N22 that is adjacent to the cell string NS12 and is connected to the second bit line BL2 together with the cell string NS12. For convenience of description, it is assumed below that each split security data has data "1".

Referring to FIG. 9B, a charge amount of each of memory cells MC11 to MC18 and memory cells MC21 to MC28 respectively connected to the cell strings NS12 and NS22 viewed in the first direction (e.g., Y direction) after the security data is written may be seen. Because the security data is written to the memory cells MC13, MC15, and MC18 connected to the cell string NS12, the charge amount of each of the memory cells MC13, MC15, and MC18 may have a value of 2 corresponding to data "1". Because security data is not written to remaining memory cells MC11, MC12, MC14, MC16, MC17, and MC21 to MC28, the charge amount of each of the memory cells MC11, MC12, MC14, MC16, MC17, and MC21 to MC28 may have a value of 1.

Referring to FIG. 9B, an accumulated charge amount of each of the cell strings NS12 and NS22 viewed in the third direction (e.g., Z direction) after the security data is written may be seen. In other words, it may be seen that the total charge amount of the memory cells MC11 to MC18 connected to the cell string NS12 is 11 and the total charge amount of the memory cells MC21 to MC28 connected to the cell string NS22 is 8. Also, referring to FIG. 9B, X-ray images of cell strings NS12 and NS22 taken in the third direction after the security data is written may be seen. Because the charge amount of the cell string NS12 is greater than the charge amount of the cell string NS22, the X-ray image of the cell string NS12 may be darker than the X-ray image of the cell string NS22. Although FIG. 9B shows that the X-ray image of the cell string NS12 is black and the X-ray image of the cell string NS22 is white, it is merely to help understanding, and an X-ray image may have a brightness corresponding to the size of a charge amount.

The memory system 10 may generate dummy data for making X-ray images to be the same or similar to each other when X-ray imaging is performed on the cell strings NS12 and NS22 and store the generated dummy data in at least one memory cell connected to the cell strings NS12 and NS22. The memory system 10 may identify a final charge amount for each of the cell strings NS12 and NS22. The final charge amounts may be the same. The final charge amounts may correspond to a current charge amount that is stored one of the cell strings. The final charge amounts may be greater than the current charge amount that is stored on each of the cell strings. The dummy data may be generated based on the final charge amounts. In detail, the memory system 10 may generate dummy data based on the charge amount (that is, a value of 11) of the cell string NS12 having a greater charge amount from between the cell strings NS12 and NS22. In other words, the memory system 10 may generate dummy data that makes the final charge amounts of the cell strings NS12 and NS22 to have a value equal to or greater than 11. For example, when the final charge amount is determined to be 11, the memory system 10 may determine that first dummy data to be written to the cell string NS12 is unnecessary. Next, the memory system 10 may generate second dummy data for increasing the current charge amount of the cell string NS22 by 3. Next, the memory system 10 may write the generated second dummy data to at least some the memory cells MC21 to MC28 connected to the cell string NS22.

Referring to FIG. 9C, a charge amount of each of memory cells MC11 to MC18 and memory cells MC21 to MC28 respectively connected to the cell strings NS12 and NS22 viewed in the first direction (e.g., Y direction) after the dummy data is written may be seen. It may be seen that the second dummy data is written to memory cells MC24, MC25, and MC27 connected to the cell string NS22.

Also, referring to FIG. 9C, an accumulated charge amount of each of the cell strings NS12 and NS22 viewed in the third direction (e.g., Z direction) after the dummy data is written may be seen. In other words, it may be seen that both the total charge amount of the memory cells MC11 to MC18 connected to the cell string NS12 and the total charge amount of the memory cells MC21 to MC28 connected to the cell string NS22 are 11.

Also, referring to FIG. 9C, X-ray images of cell strings NS12 and NS22 taken in the third direction after the dummy data is written may be seen. Because the cell string NS12 and the cell string NS22 have the same charge amount, the X-ray images of the cell strings NS12 and NS22 may have the same color.

Although FIGS. 9A to 9C show an example embodiment in which the memory system 10 splits security data and writes the split security data to only one cell string NS12, example embodiments are not limited thereto. The memory system 10 may write split security data to two cell strings. An example embodiment in which the memory system 10 writes split security data to two cell strings will be described below with reference to FIGS. 10A to 10C.

Figure 10A:
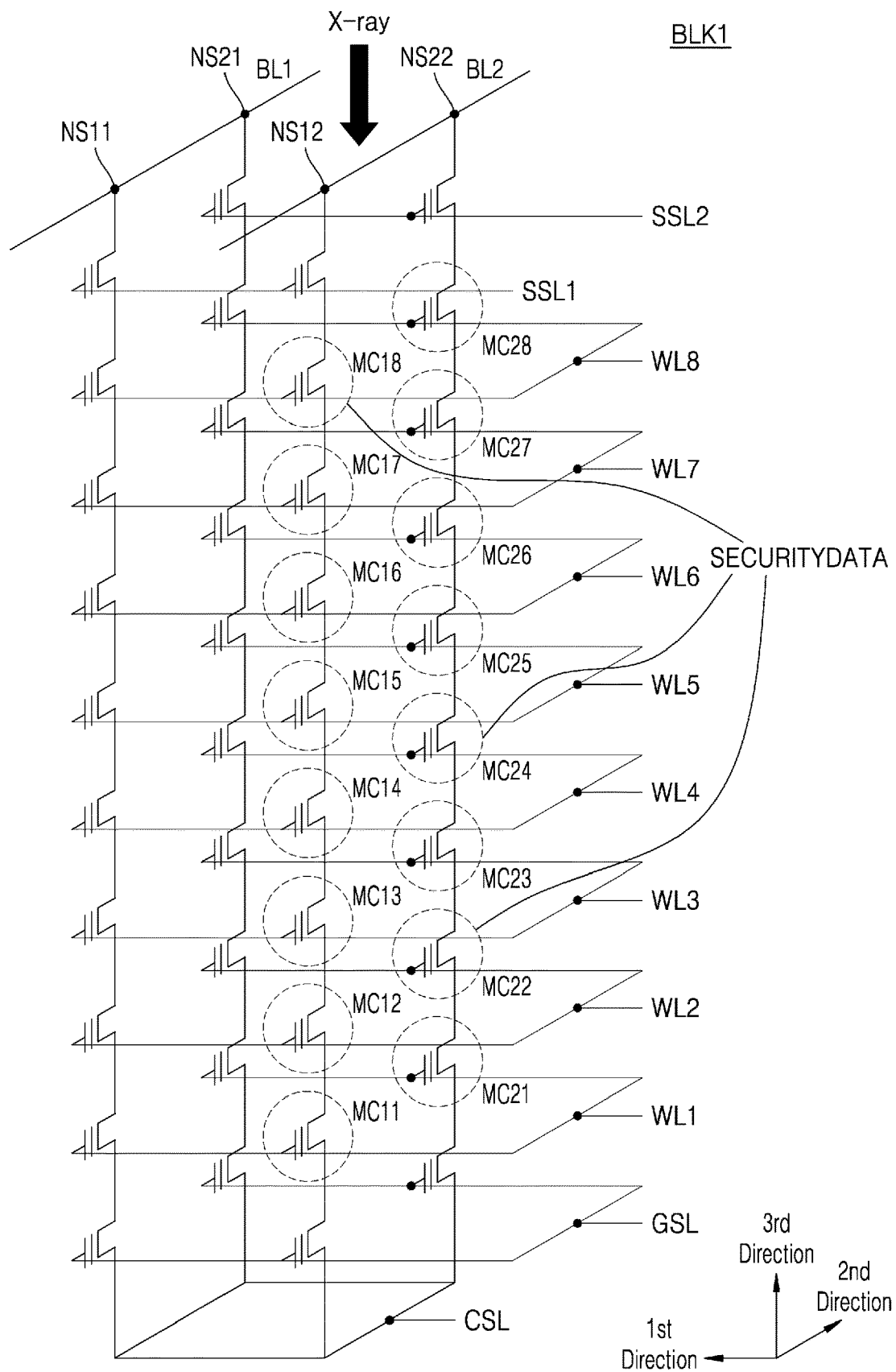
FIG. 10A is a diagram showing an X-ray imaging operation of a memory block according to an example embodiment.
Figure 10B:
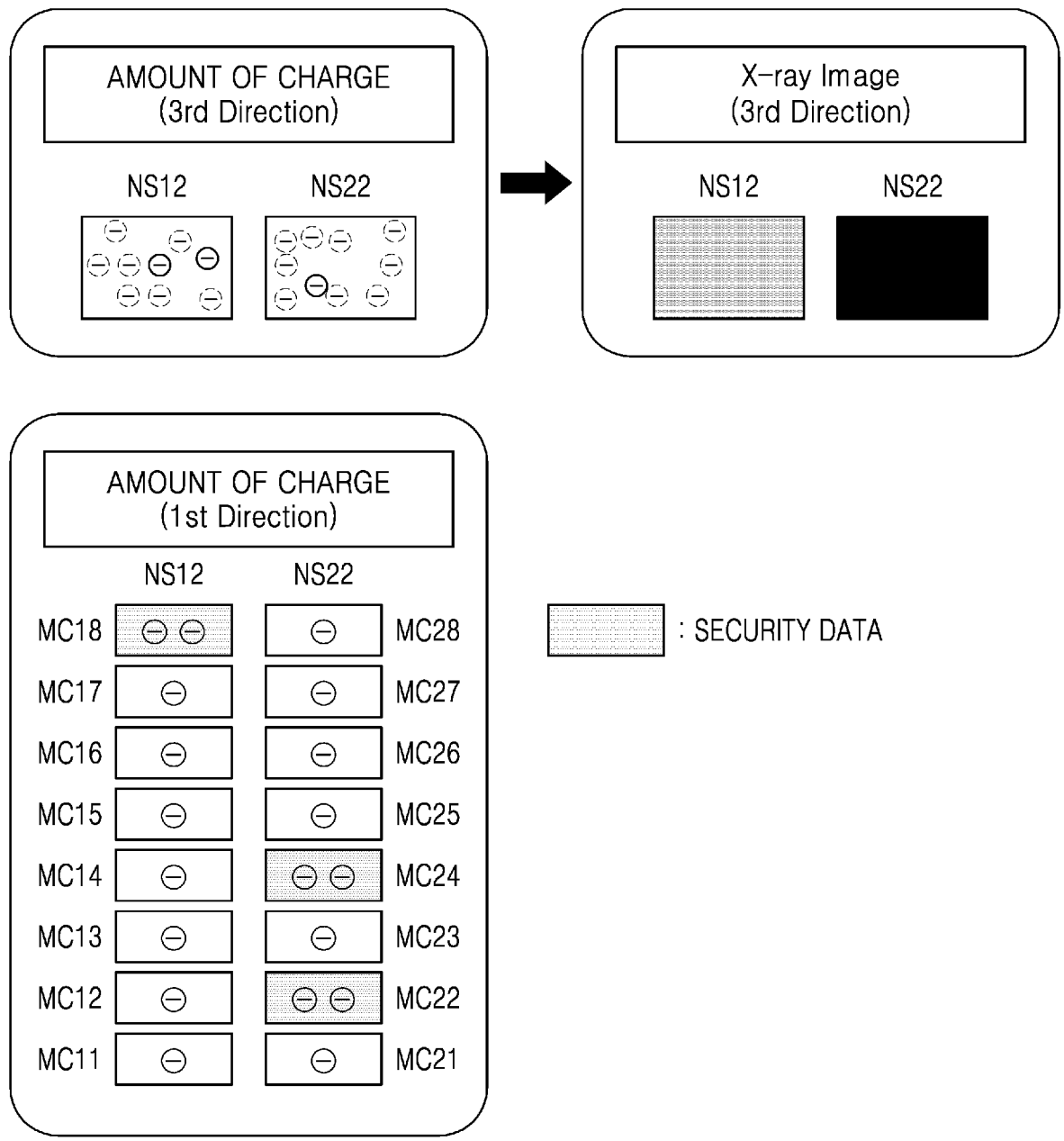
FIG. 10B is a diagram showing an X-ray image after security data is written according to an example embodiment.
Figure 10C:
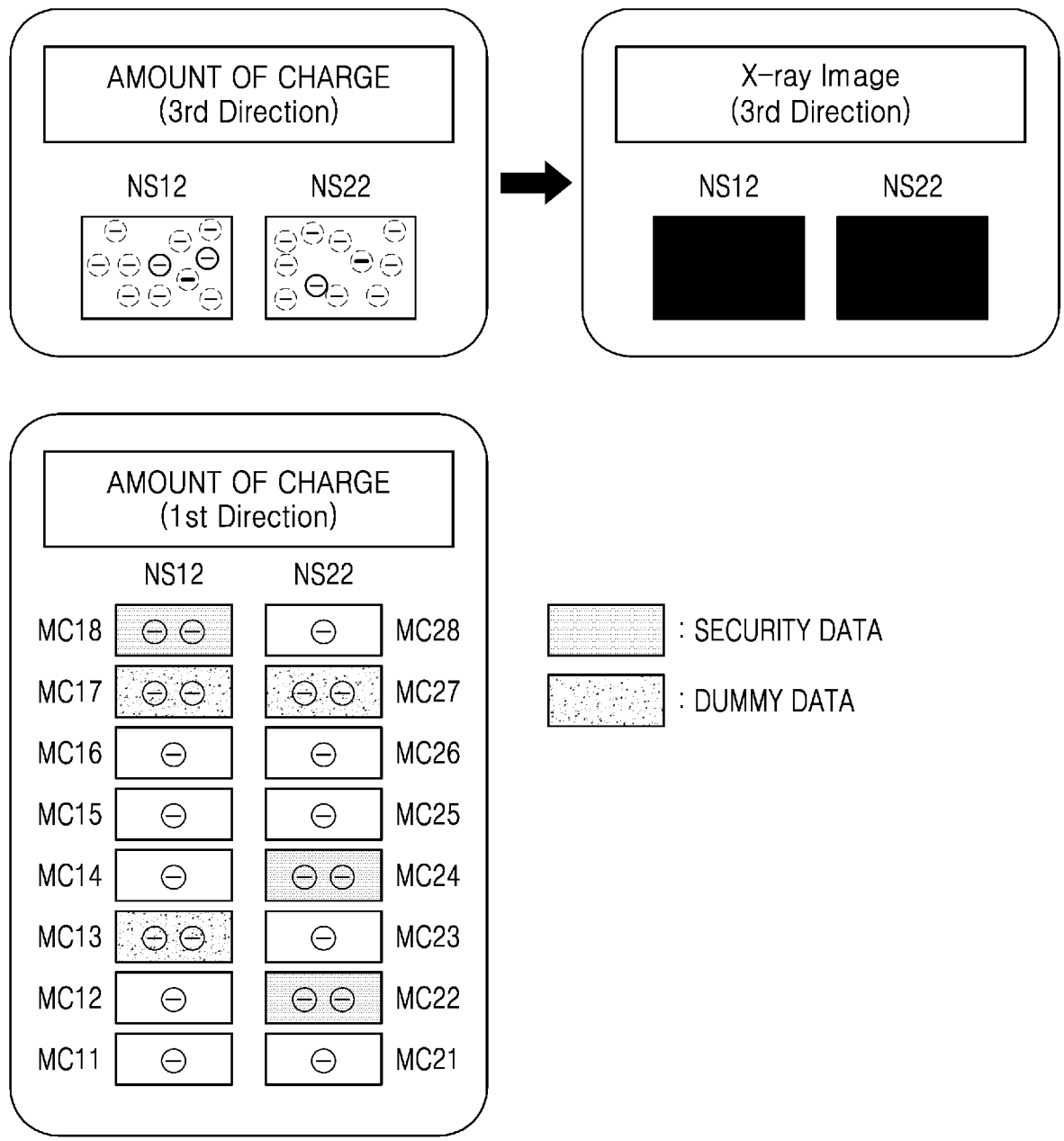
FIG. 10C is a diagram showing an X-ray image after dummy data is written according to an example embodiment.

FIG. 10A is a diagram showing an X-ray imaging operation of a memory block according to an example embodiment, FIG. 10B is a diagram showing an X-ray image after security data is written according to an example embodiment, and FIG. 10C is a diagram showing an X-ray image after dummy data is written according to an example embodiment.

Referring to FIG. 10A, the memory system 10 of FIG. 1 may split security data that needs security and store split security data to a memory cell MC18 connected to the cell string NS12 and memory cells MC22 and MC24 connected to the cell string NS22. Next, the memory system 10 may determine to write dummy data to the cell string NS12 and the cell string NS22.

Referring to FIG. 10B, a charge amount of each of memory cells MC11 to MC18 and memory cells MC21 to MC28 respectively connected to the cell strings NS12 and NS22 viewed in the first direction (e.g., Y direction) after the security data is written may be seen. Because the security data is written to the memory cell MC18 connected to the cell string NS12 and the memory cells MC22 and MC24 connected to the cell string NS22, the charge amount of each of memory cells MC18, MC22, and MC24 may have a value of 2 corresponding to data "1". Because security data is not written to remaining memory cells MC11 to MC17, MC21, MC23, and MC25 to MC28, the charge amount of each of the memory cells MC11 to MC17, MC21, MC23, and MC25 to MC28 may have a value of 1.

Referring to FIG. 10B, an accumulated charge amount of each of the cell strings NS12 and NS22 viewed in the third direction (e.g., Z direction) after the security data is written may be seen. In other words, it may be seen that the total charge amount of the memory cells MC11 to MC18 connected to the cell string NS12 is 9 and the total charge amount of the memory cells MC21 to MC28 connected to the cell string NS22 is 10. Also, referring to FIG. 10B, X-ray images of cell strings NS12 and NS22 taken in the third direction after the security data is written may be seen. Because the charge amount of the cell string NS22 is greater than the charge amount of the cell string NS12, the X-ray image of the cell string NS22 may be darker than the X-ray image of the cell string NS12.

The memory system 10 may generate dummy data for making X-ray images to be the same or similar to each other when X-ray imaging is performed on the cell strings NS12 and NS22 and store the generated dummy data in at least one memory cell connected to the cell strings NS12 and NS22. The memory system 10 may identify a final charge amount for each of the cell strings NS12 and NS22. The final charge amounts may be the same. The final charge amounts may correspond to a current charge amount that is stored one of the cell strings. The final charge amounts may be greater than the current charge amount that is stored on each of the cell strings. The dummy data may be generated based on the final charge amounts. In detail, the memory system 10 may generate dummy data based on the charge amount (that is, a value of 10) of the cell string NS22 having a greater charge amount from between the cell strings NS12 and NS22. In other words, the memory system 10 may generate dummy data that makes the final charge amounts of the cell strings NS12 and NS22 to have a value equal to or greater than 10. For example, when the final charge amount is determined to be 11, the memory system 10 may generate first dummy data for increasing the current charge amount of the cell string NS12 by 2. Next, the memory system 10 may generate second dummy data for increasing the current charge amount of the cell string NS22 by 1. Next, the memory system 10 may write the generated first dummy data to at least some the memory cells MC11 to MC18 connected to the cell string NS12 and write the generated second dummy data to at least some the memory cells MC21 to MC28 connected to the cell string NS22.

Referring to FIG. 10C, a charge amount of each of memory cells MC11 to MC18 and memory cells MC21 to MC28 respectively connected to the cell strings NS12 and NS22 viewed in the first direction (e.g., Y direction) after the dummy data is written may be seen. It may be seen that the first dummy data is written to memory cells MC13 and MC17 connected to the cell string NS12 and the second dummy data is written to a memory cell MC27 connected to the cell string NS22.

Also, referring to FIG. 10C, an accumulated charge amount of each of the cell strings NS12 and NS22 viewed in the third direction (e.g., Z direction) after the dummy data is written may be seen. In other words, it may be seen that both the total charge amount of the memory cells MC11 to MC18 connected to the cell string NS12 and the total charge amount of the memory cells MC21 to MC28 connected to the cell string NS22 are 11.

Also, referring to FIG. 10C, X-ray images of cell strings NS12 and NS22 taken in the third direction after the dummy data is written may be seen. Because the cell string NS12 and the cell string NS22 have the same charge amount, the X-ray images of the cell strings NS12 and NS22 may have the same color.

On the other hand, although FIGS. 10A to 10C show an example embodiment in which the memory system 10 writes security data to the cell strings NS12 and NS22 and writes dummy data only to the cell strings NS12 and NS22 to which the security data is written, example embodiments are not limited thereto. In detail, even when security data is written to the cell strings NS12 and NS22, the memory system 10 may write dummy data to a cell string that is adjacent to the cell strings NS12 and NS22 and does not store the security data.

Also, descriptions have been given above with reference to FIGS. 9A to 10C that the memory system 10 generate and write dummy data by comparing charge amounts of cell strings that are connected to the same bit line BL2 and are adjacent to each other, but example embodiments are not limited thereto. The memory system 10 may generate and write dummy data by comparing charge amounts between cell strings connected to different bit lines and adjacent to each other. Detailed descriptions thereof will be given below with reference to FIGS. 11A to 11C.

Figure 11A:
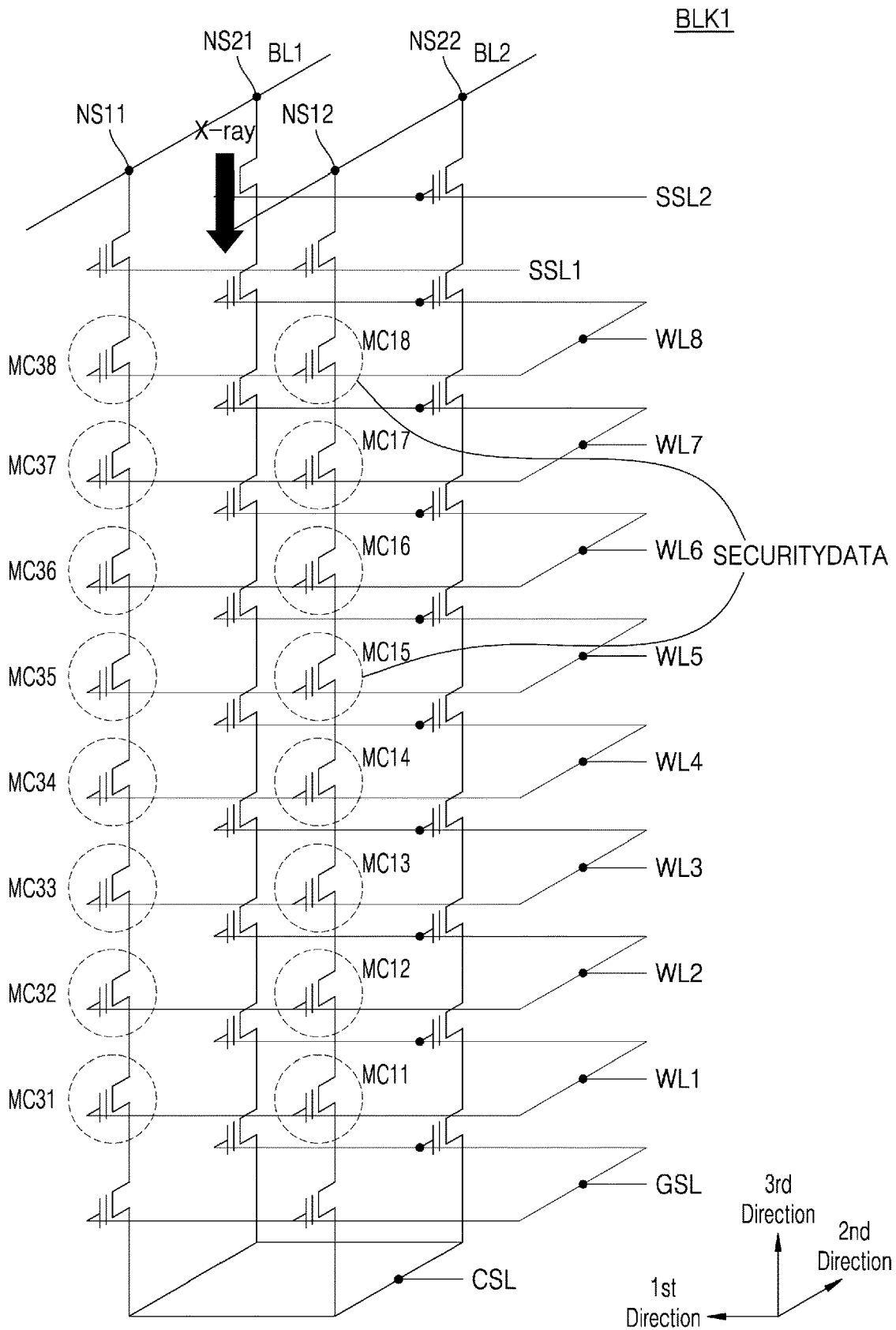
FIG. 11A is a diagram showing an X-ray imaging operation of a memory block according to an example embodiment.
Figure 11B:
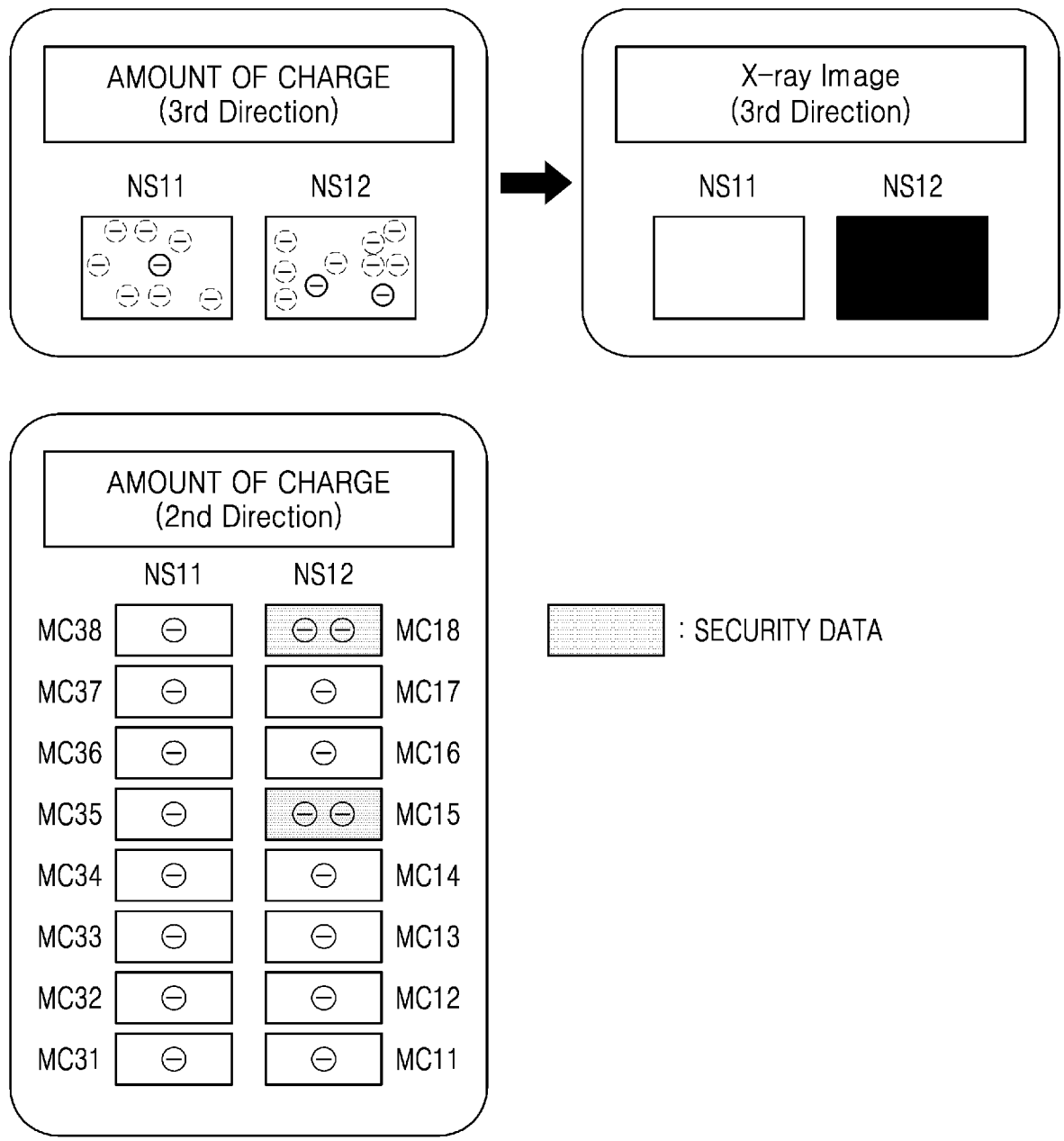
FIG. 11B is a diagram showing an X-ray image after security data is written according to an example embodiment.
Figure 11C:
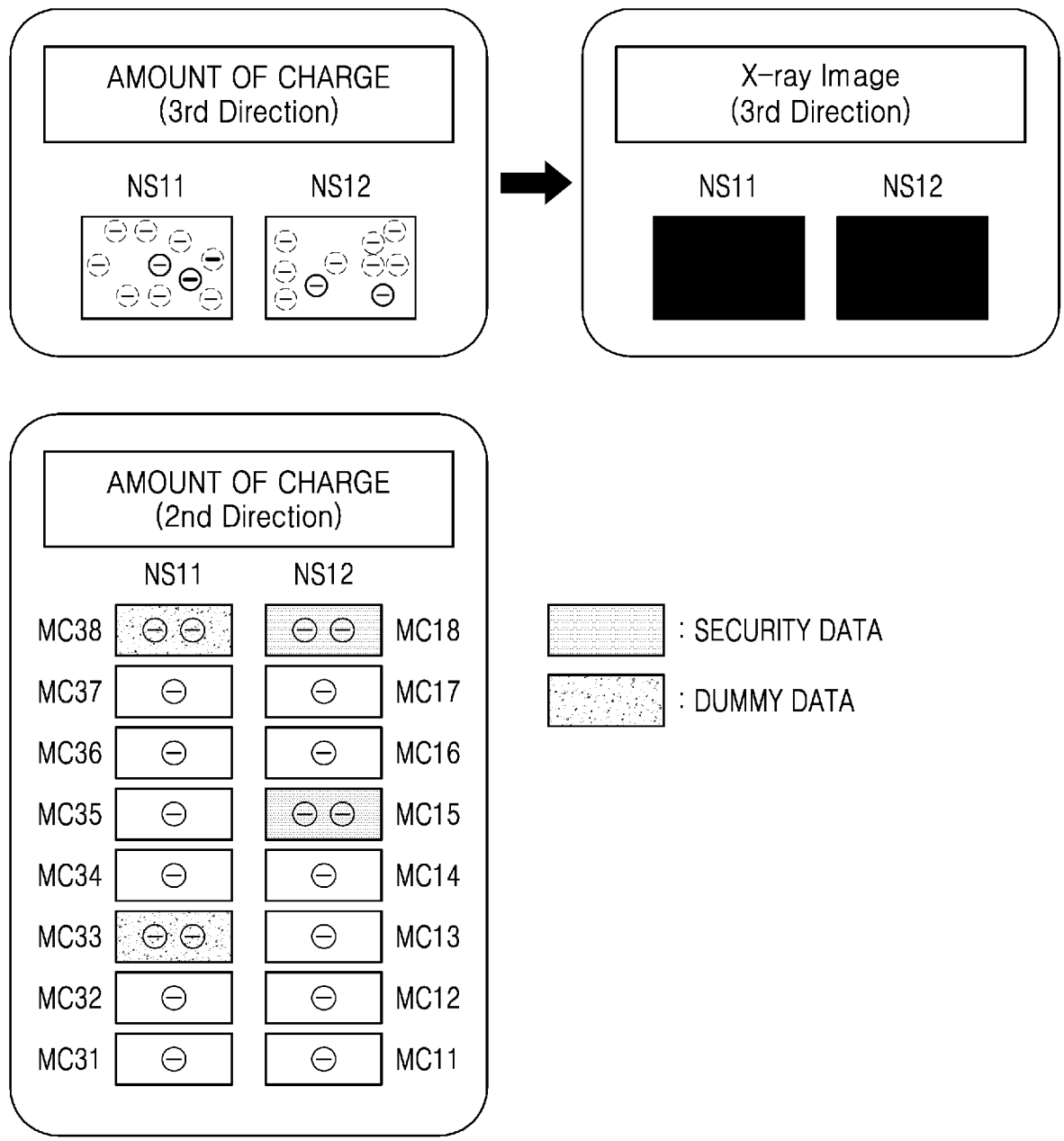
FIG. 11C is a diagram showing an X-ray image after dummy data is written according to an example embodiment.

FIG. 11A is a diagram showing an X-ray imaging operation of a memory block according to an example embodiment, FIG. 11B is a diagram showing an X-ray image after security data is written according to an example embodiment, and FIG. 11C is a diagram showing an X-ray image after dummy data is written according to an example embodiment.

Referring to FIG. 1, the memory system 10 of FIG. 1 may split security data that needs security and store split security data in memory cells MC15 and MC18 connected to the cell string NS12. Next, the memory system 10 may determine to write dummy data to the cell string N22 that is adjacent to the cell string NS12 but is connected to a different bit line (that is, the first bit line BL1).

Referring to FIG. 11B, a charge amount of each of memory cells MC11 to MC18 and memory cells MC31 to MC38 respectively connected to cell strings NS11 and NS12 viewed in the second direction (e.g., X direction) after the security data is written may be seen. Because the security data is written to the memory cells MC15 and MC18 connected to the cell string NS12, the charge amount of each of the memory cells MC15 and MC18 may have a value of 2 corresponding to data "1". Because security data is not written to remaining memory cells MC11 to MC14, MC16, MC17, and MC31 to MC38, the charge amount of each of the memory cells MC11 to MC14, MC16, MC17, and MC31 to MC38 may have a value of 1.

Referring to FIG. 11B, an accumulated charge amount of each of the cell strings NS11 and NS12 viewed in the third direction (e.g., Z direction) after the security data is written may be seen. In other words, it may be seen that the total charge amount of the memory cells MC31 to MC38 connected to the cell string NS11 is 8 and the total charge amount of the memory cells MC11 to MC18 connected to the cell string NS12 is 10. Also, referring to FIG. 11B, X-ray images of cell strings NS11 and NS12 taken in the third direction after the security data is written may be seen. Because the charge amount of the cell string NS12 is greater than the charge amount of the cell string NS11, the X-ray image of the cell string NS12 may be darker than the X-ray image of the cell string NS11.

The memory system 10 may generate dummy data for making X-ray images to be the same or similar to each other when X-ray imaging is performed on the cell strings NS11 and NS12 and store the generated dummy data in at least one memory cell connected to the cell strings NS11 and NS12. The memory system 10 may identify a final charge amount for each of the cell strings NS12 and NS22. The final charge amounts may be the same. The final charge amounts may correspond to a current charge amount that is stored one of the cell strings. The final charge amounts may be greater than the current charge amount that is stored on each of the cell strings. The dummy data may be generated based on the final charge amounts. In detail, the memory system 10 may generate dummy data that makes the final charge amounts of the cell strings NS11 and NS12 to have a value equal to or greater than 10. For example, when the final charge amount is determined to be 10, the memory system 10 may determine that first dummy data to be written to the cell string NS12 is unnecessary. Next, the memory system 10 may generate second dummy data for increasing the current charge amount of the cell string NS11 by 2.

Referring to FIG. 11C, a charge amount of each of memory cells MC11 to MC18 and memory cells MC31 to MC38 respectively connected to cell strings NS11 and NS12 viewed in the second direction (e.g., X direction) after the dummy data is written may be seen. It may be seen that the second dummy data is written to memory cells MC33 and MC38 connected to the cell string NS11.

Also, referring to FIG. 11C, an accumulated charge amount of each of the cell strings NS11 and NS12 viewed in the third direction (e.g., Z direction) after the dummy data is written may be seen. In other words, it may be seen that both the total charge amount of the memory cells MC31 to MC38 connected to the cell string NS11 and the total charge amount of the memory cells MC21 to MC28 connected to the cell string NS12 are 10.

Also, referring to FIG. 11C, X-ray images of cell strings NS11 and NS12 taken in the third direction after the dummy data is written may be seen. Because the cell string NS11 and the cell string NS12 have the same charge amount, the X-ray images of the cell strings NS11 and NS12 may have the same color.

An example embodiment in which dummy data is written to memory cells connected to a first cell string to which security data is written or a second cell string adjacent to the first cell string is described above with reference to FIGS. 9A to 11C. However, example embodiments are not limited thereto, and dummy data may also be written to a third cell string not adjacent to the first cell string in the above-described manner.

Also, an example embodiment in which a charge amount is calculated based on a cell string and dummy data is written is described above with reference to FIGS. 9A to 11C, but example embodiments are not limited thereto. In detail, a charge amount may be calculated based on a word line (or a bit line), dummy data may be generated based on a calculated charge amount, and the dummy data may be written to a first word line (or a first bit line) to which security data is written or an adjacent second word line (or an adjacent second bit line). Because the present example embodiment may be performed in substantially the same manner as the example embodiment based on the cell string, descriptions identical to those already given above will be omitted.

Figure 12:
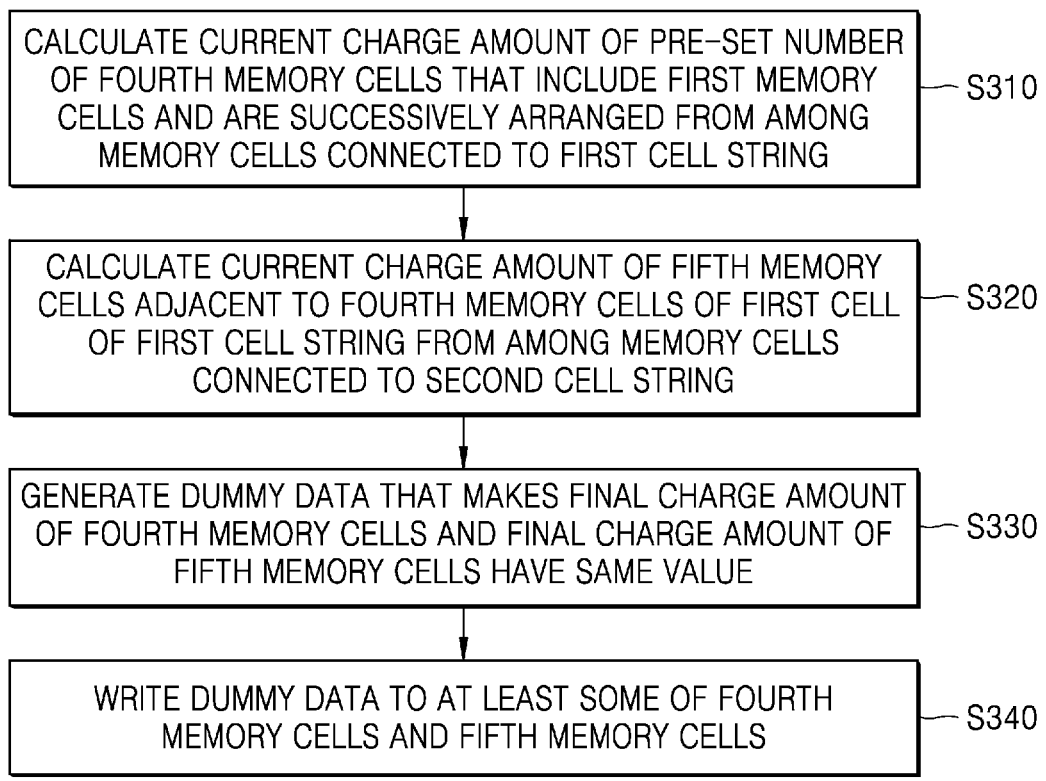
FIG. 12 is a flowchart showing an operation for generating and writing dummy data according to an example embodiment.

FIG. 12 is a flowchart showing an operation for generating and writing dummy data according to an example embodiment. In detail, FIG. 12 is a diagram for describing a modified example embodiment of operations S120 and S130 of FIG. 7.

Referring to FIGS. 1, 7 and 12, the memory system 10 may calculate current charge amounts of a pre-set number of fourth memory cells that include a first memory cell and are successively arranged, from among memory cells connected to a first cell string (operation S310). In detail, the memory system 10 may identify the first cell string corresponding to the first memory cell having written thereto security data, identify the pre-set number of the fourth memory cells that include the first memory cell and are successively arranged from among the memory cells connected to the first cell string, and calculate current charge amounts based on data values written to the fourth memory cells.

Next, the memory system 10 may calculate current charge amounts of fifth memory cells adjacent to the fourth memory cells of the first cell string from among memory cells connected to a second cell string (operation S320). In detail, the memory system 10 may identify the second cell string adjacent to the first cell string, identify the fifth memory cells respectively adjacent to the fourth memory cells from among the memory cells connected to the second cell string, and calculate current charge amounts based on data values written to the fifth memory cells.

Next, the memory system 10 may generate dummy data that makes the final charge amount of the fourth memory cells and the final charge amount of the fifth memory cells to have the same value (operation S330). In detail, the memory system 10 may determine a first charge amount, which is a basis for generating dummy data, based on the current charge amount of the fourth memory cells and the current charge amount of the fifth memory cells. For example, the first charge amount may be determined by the memory system 10 and may be equal to or greater than the largest charge amount from among the current charge amounts of the fourth memory cells and the current charge amounts of the fifth memory cells.

Next, the memory system 10 may generate dummy data that makes the final charge amount of the fourth memory cells and the final charge amount of the fifth memory cells to be the first charge amount. For example, the memory system 10 may calculate a difference between the first charge amount and the current charge amount of the fourth memory cells and may generate first dummy data corresponding to the calculated difference. Next, the memory system 10 may calculate a difference between the first charge amount and the current charge amount of the fifth memory cells and may generate second dummy data corresponding to the calculated difference.

Next, the memory system 10 may write generated dummy data to at least some of the fourth memory cells and the fifth memory cells (operation S340). In detail, the memory system 10 may write the first dummy data to the remaining memory cells other than the first memory cell from among the fourth memory cells and write the second dummy data to the fifth memory cells. On the other hand, when the fifth memory cells include another first memory cell to which data that needs security is written, the memory system 10 may write the second dummy data to the remaining memory cells other than the other first memory cell from among the fifth memory cells.

Although FIG. 12 shows that, in operation S330, the memory system 10 generates dummy data to make the final charge amount of the fourth memory cells and the final charge amount of the fifth memory cells to have the same value, example embodiments are not limited thereto. For example, the memory system 10 may generate dummy data that makes the final charge amount of the fourth memory cells and the final charge amount of the fifth memory cells to have a pre-set ratio such as 1:1, or another pre-set ratio that is different than 1:1.

Figure 13A:
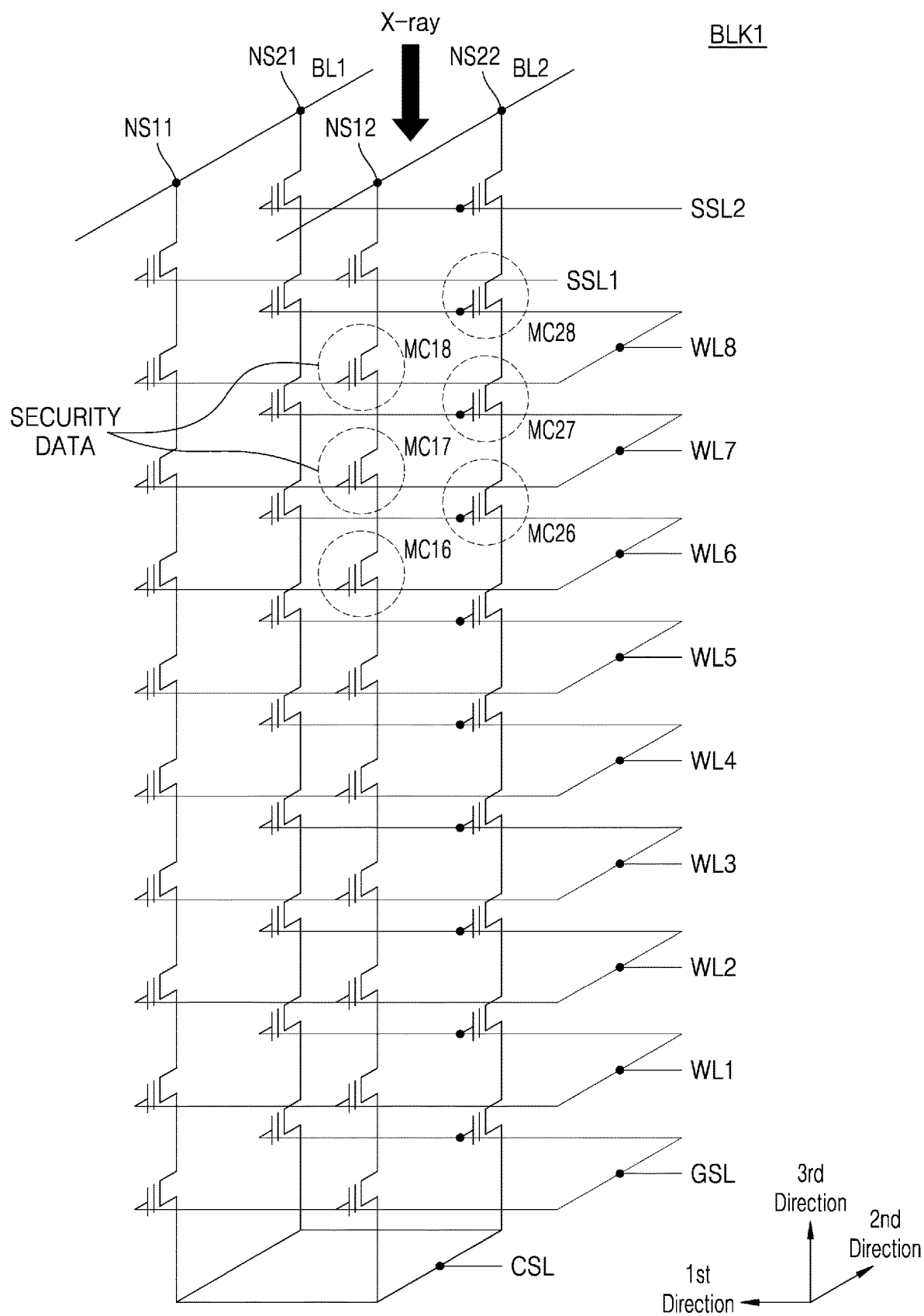
FIG. 13A is a diagram showing an X-ray imaging operation of a memory block according to an example embodiment.
Figure 13B:
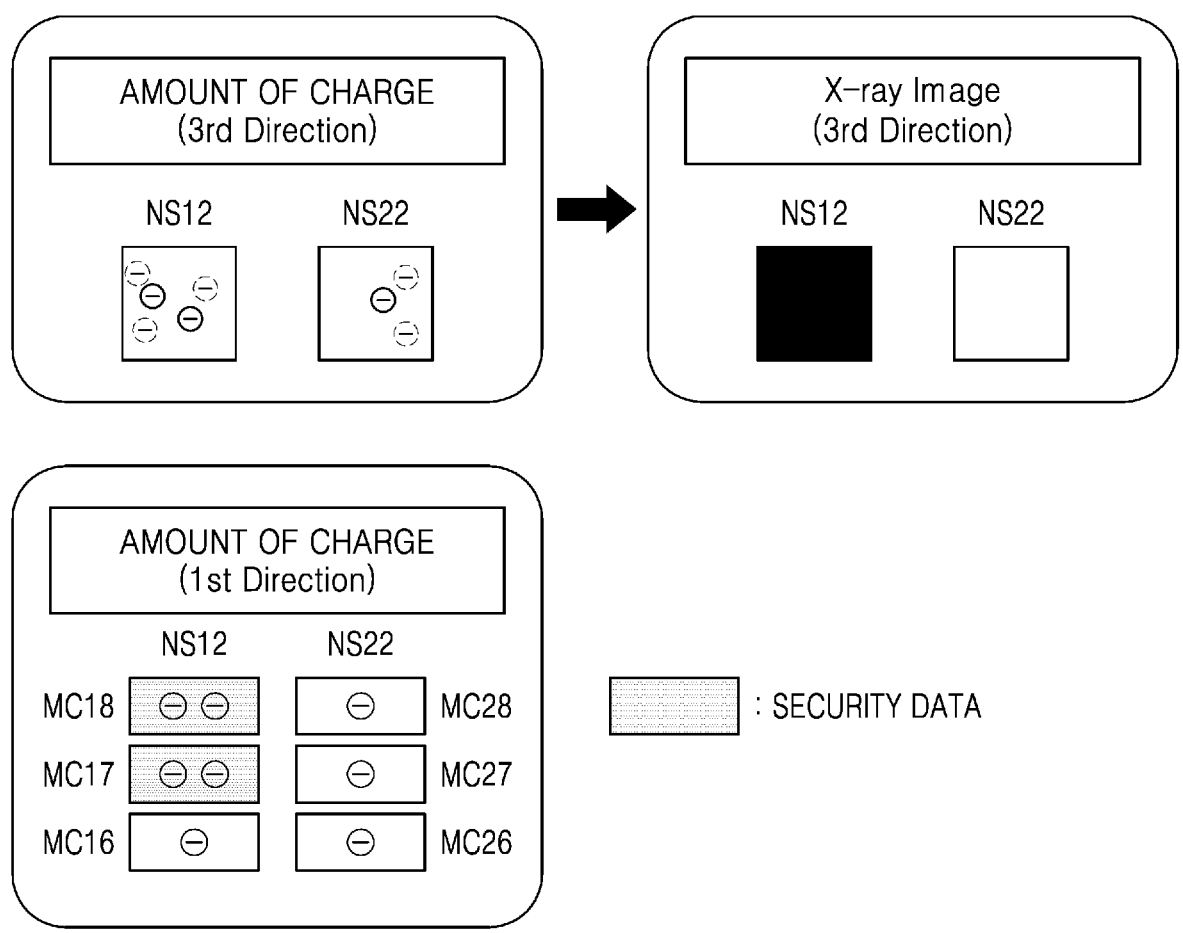
FIG. 13B is a diagram showing an X-ray image after security data is written according to an example embodiment.
Figure 13C:
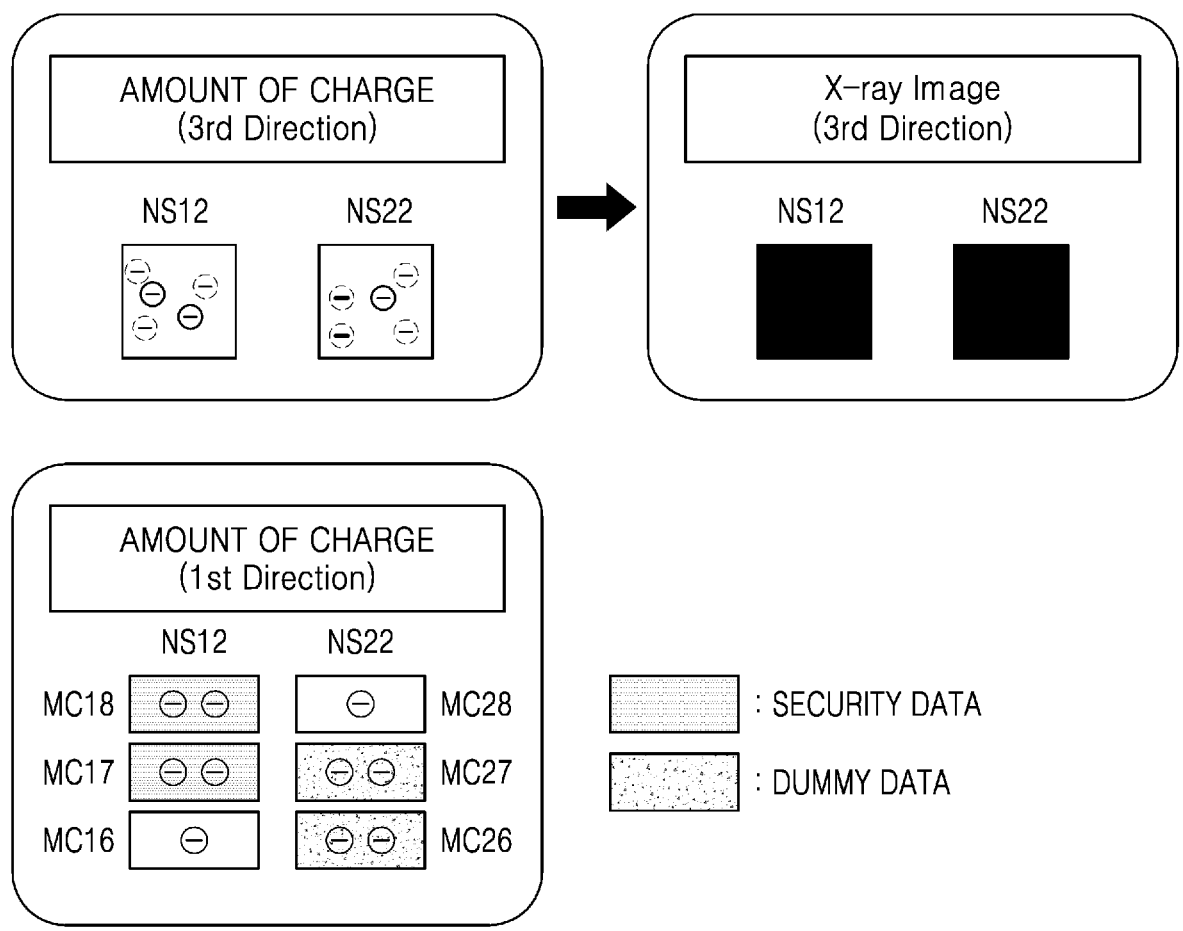
FIG. 13C is a diagram showing an X-ray image after dummy data is written according to an example embodiment.

FIG. 13A is a diagram showing an X-ray imaging operation of a memory block according to an example embodiment, FIG. 13B is a diagram showing an X-ray image after security data is written according to an example embodiment, and FIG. 13C is a diagram showing an X-ray image after dummy data is written according to an example embodiment. In detail, FIGS. 13A to 13C are diagrams for describing the method of operating a memory system of FIG. 12 in detail.

FIG. 13A shows cell strings NS11 and NS21 connected to a first bit line BL1 and cell strings NS12 and NS22 connected to a second bit line BL2 in memory cell arrays of the memory block BLK1. Referring to FIG. 13A, the memory system 10 of FIG. 1 may split security data and store split security data in memory cells MC17 and MC18 connected to the cell string NS12.

Next, the memory system 10 may identify the cell string NS12 to which the memory cells MC17 and MC18 having written thereto the security data are connected, and identify a pre-set number (e.g., 3) of memory cells MC16, MC17, and MC18 including the memory cells MC17 and MC18 having written thereto the security data from among the memory cells connected to the cell string NS12. Next, the memory system 10 may identify memory cells MC26, MC27, and MC28 respectively adjacent to the memory cells MC16, MC17, and MC18 from among memory cells connected to the cell string NS22 adjacent to the cell string NS12. Next, the memory system 10 may determine to write dummy data to at least some of identified memory cells MC16, MC17, MC18, MC26, MC27, and MC28.

Referring to FIG. 13B, a charge amount of each of memory cells MC16 to MC18 and memory cells MC26 to MC28 respectively connected to the cell strings NS12 and NS22 viewed in the first direction (e.g., Y direction) after the security data is written may be seen. Because the security data is written to the memory cells MC17 and MC18 connected to the cell string NS12, the charge amount of each of the memory cells MC17 and MC18 may have a value of 2 corresponding to data "1". Because security data is not written to remaining memory cells MC16 and MC26 to MC28, the charge amount of each of the remaining memory cells MC16 and MC26 to MC28 may have a value of 1.

Referring to FIG. 13B, accumulated charge amounts of the memory cells MC16 to MC18 of the cell string NS12 and the memory cells MC26 to MC28 of the cell string NS22 viewed in the third direction (e.g., the Z direction) after the security data is written may be seen. In other words, it may be seen that the total charge amount of the memory cells MC16 to MC18 connected to the cell string NS12 is 5 and the total charge amount of the memory cells MC26 to MC28 connected to the cell string NS22 is 3. Also, referring to FIG. 13B, X-ray images of cell strings NS12 and NS22 taken in the third direction after the security data is written may be seen. Because the charge amount of the cell string NS12 is greater than the charge amount of the cell string NS22, the X-ray image of the cell string NS12 may be darker than the X-ray image of the cell string NS22.

The memory system 10 may generate dummy data for making X-ray images to be the same or similar to each other when X-ray imaging is performed on the cell strings NS12 and NS22 and store the generated dummy data in at least one memory cell connected to the cell strings NS12 and NS22. The memory system 10 may identify a final charge amount for each of the cell strings NS12 and NS22. The final charge amounts may be the same. The final charge amounts may correspond to a current charge amount that is stored one of the cell strings. The final charge amounts may be greater than the current charge amount that is stored on each of the cell strings. The dummy data may be generated based on the final charge amounts. In detail, the memory system 10 may generate dummy data that makes the final charge amounts of the cell strings NS12 and NS22 to have a value equal to or greater than 5. For example, when the final charge amount is determined to be 5, the memory system 10 may determine that first dummy data to be written to the cell string NS12 is unnecessary. Next, the memory system 10 may generate second dummy data for increasing the current charge amount of the cell string NS22 by 2.

Referring to FIG. 13C, a charge amount of each of memory cells MC16 to MC18 and memory cells MC26 to MC28 respectively connected to the cell strings NS12 and NS22 viewed in the first direction (e.g., Y direction) after the dummy data is written may be seen. It may be seen that the second dummy data is written to memory cells MC26 and MC27 connected to the cell string NS22.

Referring to FIG. 13C, accumulated charge amounts of the memory cells MC16 to MC18 of the cell string NS12 and the memory cells MC26 to MC28 of the cell string NS22 viewed in the third direction (e.g., the Z direction) after the dummy data is written may be seen. In other words, it may be seen that both the total charge amount of the memory cells MC16 to MC18 of the cell string NS12 and the total charge amount of the memory cells MC26 to MC28 of the cell string NS22 are 5.

Also, referring to FIG. 13C, X-ray images of cell strings NS12 and NS22 taken in the third direction after the dummy data is written may be seen. Because the cell string NS12 and the cell string NS22 have the same charge amount, the X-ray images of the cell strings NS12 and NS22 may have the same color.

Figure 14A:
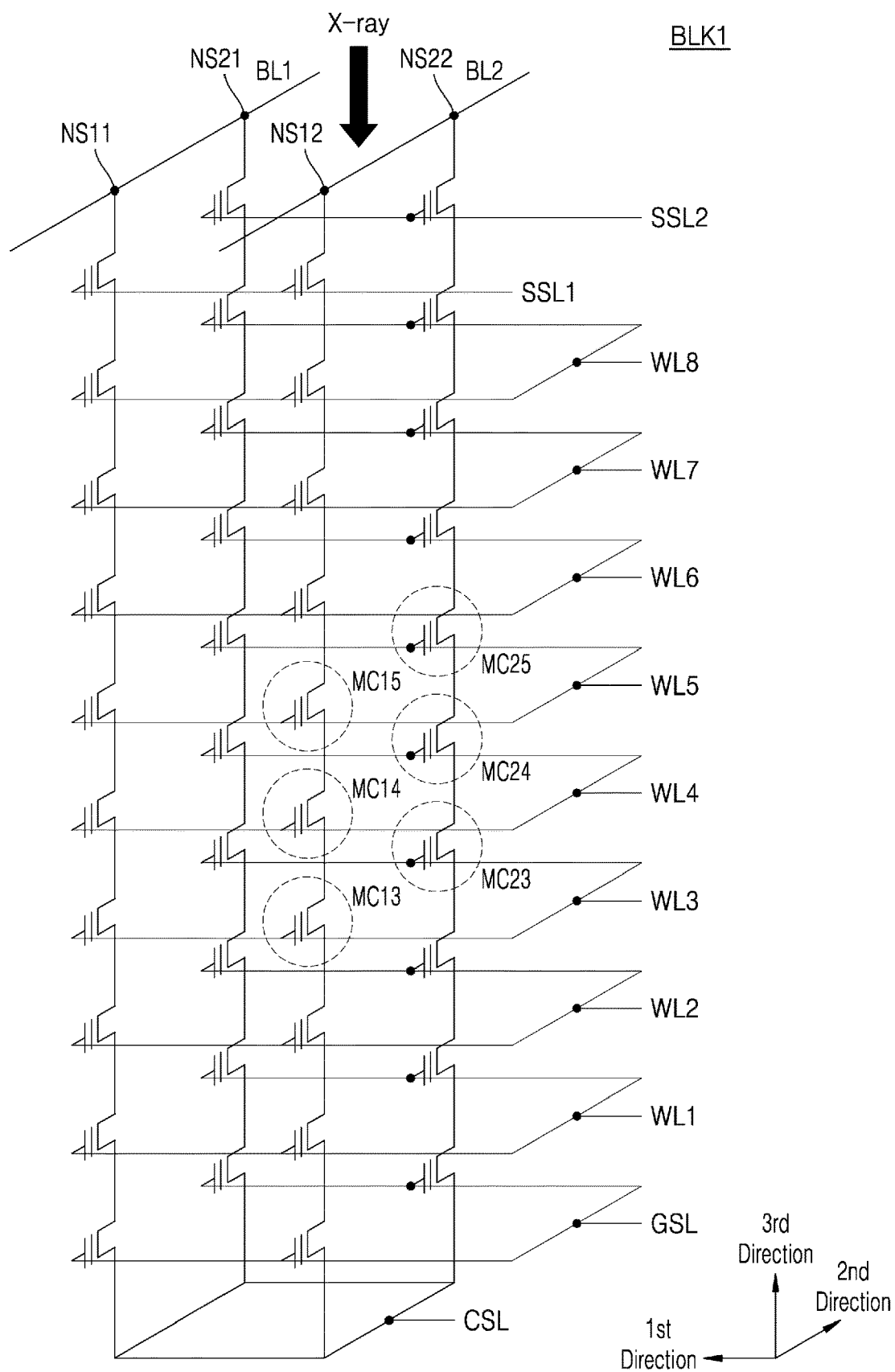
FIG. 14A is a diagram showing an X-ray imaging operation of a memory block according to an example embodiment.
Figure 14B:
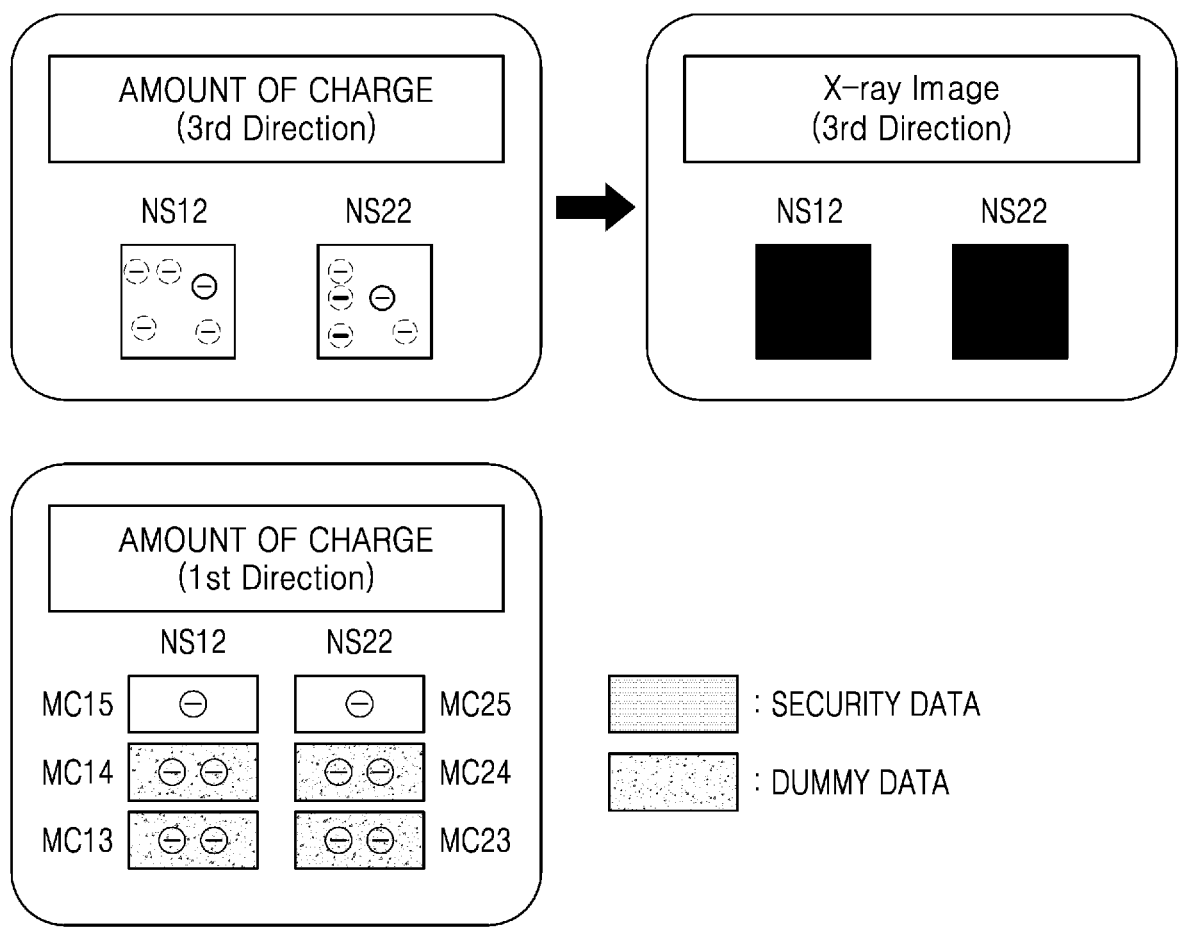
FIG. 14B is a diagram showing an X-ray image after dummy data is written according to an example embodiment.

FIG. 14A is a diagram showing an X-ray imaging operation of a memory block according to an example embodiment, and FIG. 14B is a diagram showing an X-ray image after dummy data is written according to an example embodiment. In detail, FIGS. 14A and 14B are diagrams for describing a dummy data write operation that may be additionally performed after the operations of the memory system 10 shown in FIGS. 13A to 13C.

The memory system 10 may additionally write dummy data to memory cells even after dummy data is written to memory cells MC27 and MC28 of the cell string NS22. Referring to FIG. 14A, the memory system 10 may determine to additionally write dummy data to a pre-set number of successive memory cells MC13 to MC15 from among memory cells connected to the cell string NS12 other than the pre-set number of memory cells MC16 to MC18.

Also, according to example embodiments, the memory system 10 may determine to additionally write dummy data to a pre-set number of successive memory cells MC23 to MC25 from among memory cells connected to the cell string NS22 other than the pre-set number of memory cells MC26 to MC28.

Because data is not written to the memory cells MC13 to MC15 and memory cells MC23 to MC25, the charge amount of each of the memory cells MC13 to MC15 and memory cells MC23 to MC25 may have a value of 1. In other words, the charge amounts of the memory cells MC13 to MC15 and memory cells MC23 to MC25 may be identical to the charge amounts of the memory cells MC26 to MC28 of FIG. 13B. Therefore, the memory system 10 may write the second dummy data generated in FIG. 13C to at least some of the memory cells MC13 to MC15 and at least some of the memory cells MC23 to MC25.

Referring to FIG. 14B, a charge amount of each of the memory cells MC13 to MC15 and the memory cells MC23 to MC25 respectively connected to the cell strings NS12 and NS22 viewed in the first direction (e.g., Y direction) after the dummy data is written may be seen. It may be seen that the second dummy data is written to memory cells MC13 and MC14 connected to the cell string NS12 and memory cells MC23 and MC24 connected to the cell string NS22.

Referring to FIG. 14B, accumulated charge amounts of the memory cells MC13 to MC15 of the cell string NS12 and the memory cells MC23 to MC25 of the cell string NS22 viewed in the third direction (e.g., the Z direction) after the dummy data is written may be seen. In other words, it may be seen that both the total charge amount of the memory cells MC13 to MC15 of the cell string NS12 and the total charge amount of the memory cells MC23 to MC25 of the cell string NS22 are 5.

Also, referring to FIG. 14B, X-ray images of cell strings NS12 and NS22 taken in the third direction after the dummy data is written may be seen. Because the cell string NS12 and the cell string NS22 have the same charge amount, the X-ray images of the cell strings NS12 and NS22 may have the same color.

The memory system 10 as described above may generate dummy data based on successively arranged memory cells, which is a unit smaller than one cell string, and write generated dummy data. Therefore, it may be more difficult for an unauthorized user to distinguish data having actual meanings from dummy data as compared to the case where dummy data is written based on cell strings.

Also, an example embodiment in which a charge amount is calculated based on memory cells included in a cell string and dummy data is written is described above with reference to FIGS. 13A to 14B, but example embodiments are not limited thereto. In detail, a charge amount may be calculated based on memory cells included in a word line (or a bit line), dummy data may be generated based on a calculated charge amount, and the dummy data may be written to memory cells connected to a first word line (or a first bit line) to which data that needs security is written or an adjacent second word line (or an adjacent second bit line). Because the present example embodiment may be performed in substantially the same manner as the example embodiment based on memory cells included in cell strings, descriptions identical to those already given above will be omitted.

Figure 15:
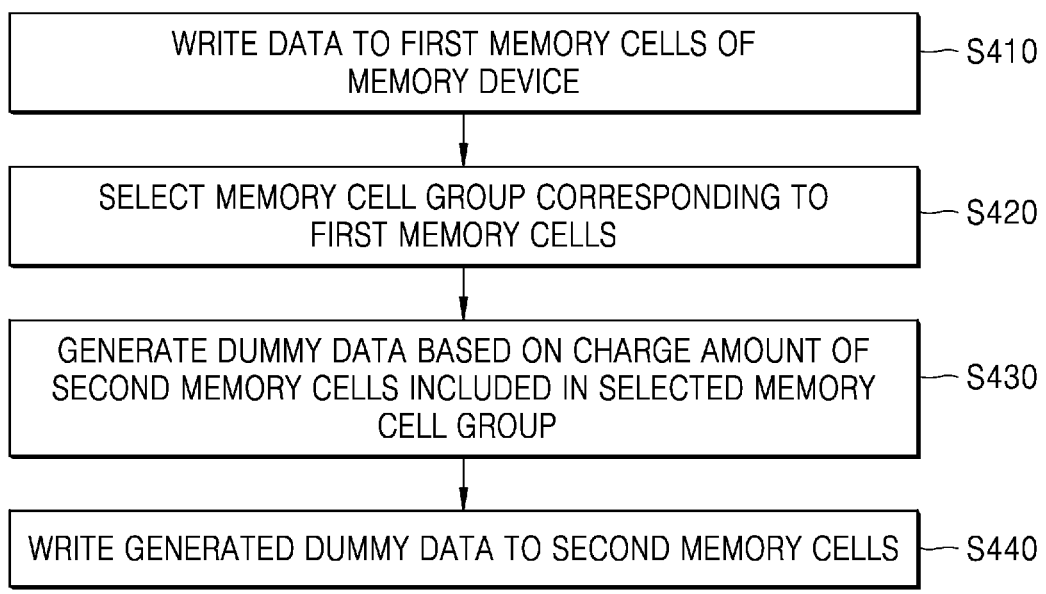
FIG. 15 is a flowchart of a method of operating a memory system according to an example embodiment.

FIG. 15 is a flowchart of a method of operating a memory system according to an example embodiment. In detail, FIG. 15 is a diagram for describing a modified example embodiment of FIG. 7. At least some of operations constituting the method shown in FIG. 15 may be performed by the memory controller 100 of the memory system 10.

Referring to FIGS. 1 and 15, the memory system 10 may write data to first memory cells of the memory device 200 (operation S410). In detail, the memory system 10 may split security data that needs security and distribute split security data in one storage region of the memory device 200. For example, the data write module 110 may randomly split the security data, randomly select first memory cells from among a plurality of memory cells included in one storage region of the memory device 200, and write split security data to the selected first memory cells.

Next, the memory system 10 may select a memory cell group corresponding to each of the first memory cells (operation S420). In detail, for each of the first memory cells, the memory system 10 may select a memory cell group including the first memory cell and at least some of memory cells located within a pre-set distance from the first memory cell. However, example embodiments are not limited thereto, and the memory system 10 may select a memory cell group corresponding to the first memory cell in various ways. For example, the memory system 10 may be implemented to identify a memory cell group corresponding to the first memory cell, based on information regarding memory cell groups respectively corresponding to memory cells. The memory cell group corresponding to the first memory cell may be implemented to include not only adjacent memory cells but also non-adjacent memory cells.

Next, the memory system 10 may generate dummy data based on charge amounts of second memory cells included in the selected memory cell group (operation S430). In detail, the memory system 10 may calculate the charge amount of each of second memory cells included in the memory cell group and generate dummy data that makes the final charge amount of a plurality of strings included in the memory cell group to be the same based on a result of the calculation. Here, the strings may include at least one of a plurality of word lines included in a memory cell group, a plurality of bit lines included in the memory cell group, and a plurality of cell strings included in the memory cell group.

In one example embodiment, the memory system 10 may generate dummy data that makes the final charge amounts of the cell strings included in the memory cell group to be the same. For example, when the memory system 10 includes four cell strings, the memory system 10 may calculate the respective current charge amounts of the four cell strings based on respective data values of memory cells connected to the four cell strings and generate dummy data that makes the final charge amounts of the four cell strings to be the same as one another.

In another example embodiment, the memory system 10 may generate dummy data that makes the final charge amounts of word lines (or bit lines) included in the memory cell group to be the same. For example, when the memory system 10 includes four word lines (or bit lines), the memory system 10 may calculate the respective current charge amounts of the four word lines (or bit lines) based on respective data values of memory cells connected to the four word lines (or bit lines) and generate dummy data that makes the final charge amounts of the four word lines (or bit lines) to be the same as one another.

Next, the memory system 10 may write generated dummy data to the second memory cells included in the memory cell group (operation S440). In detail, the memory system 10 may write the generated dummy data to at least some of the remaining memory cells other than the first memory cell in the memory cell group.

Figure 16A:
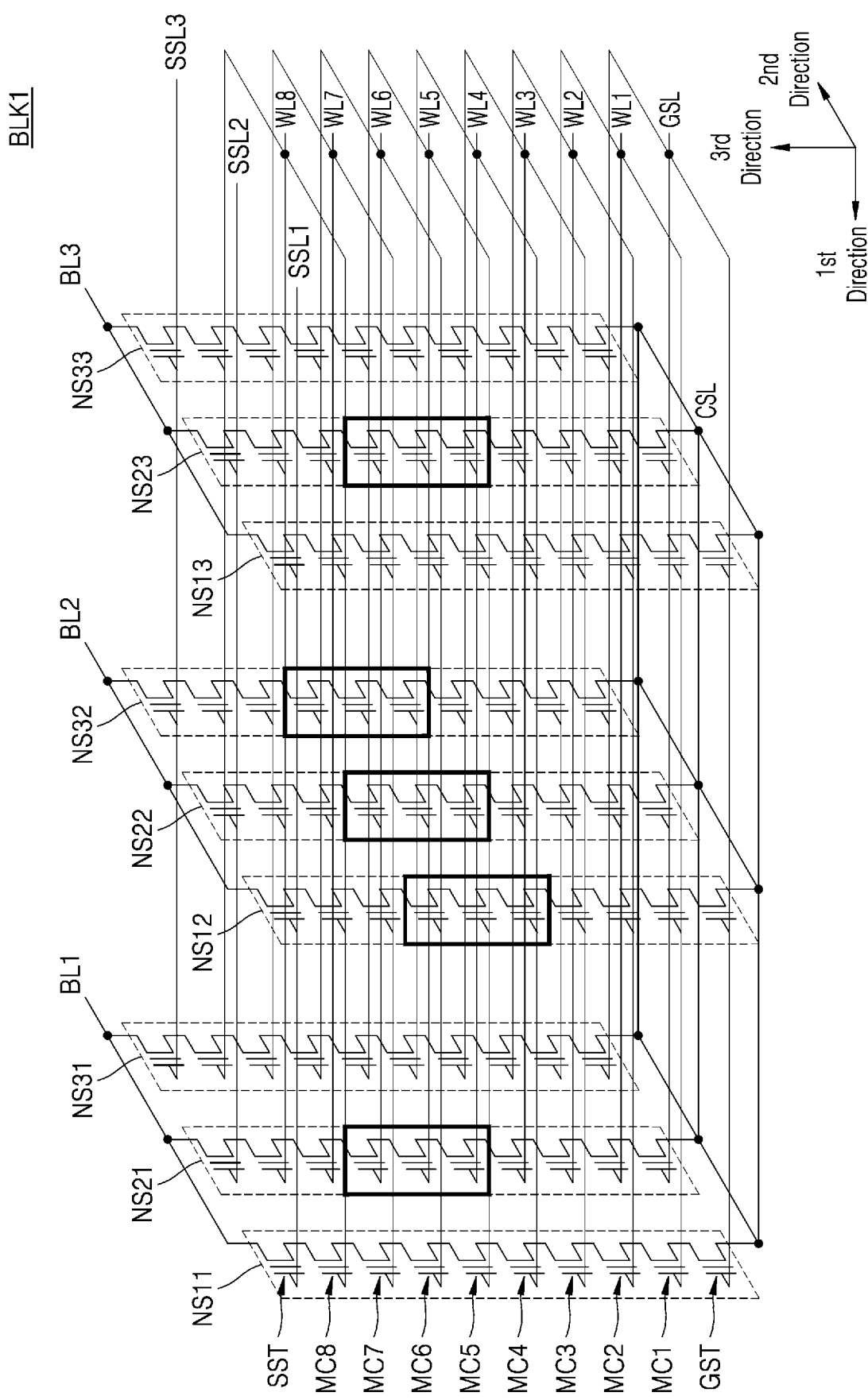
FIG. 16A is a diagram showing a memory cell group according to an example embodiment.
Figure 16B:
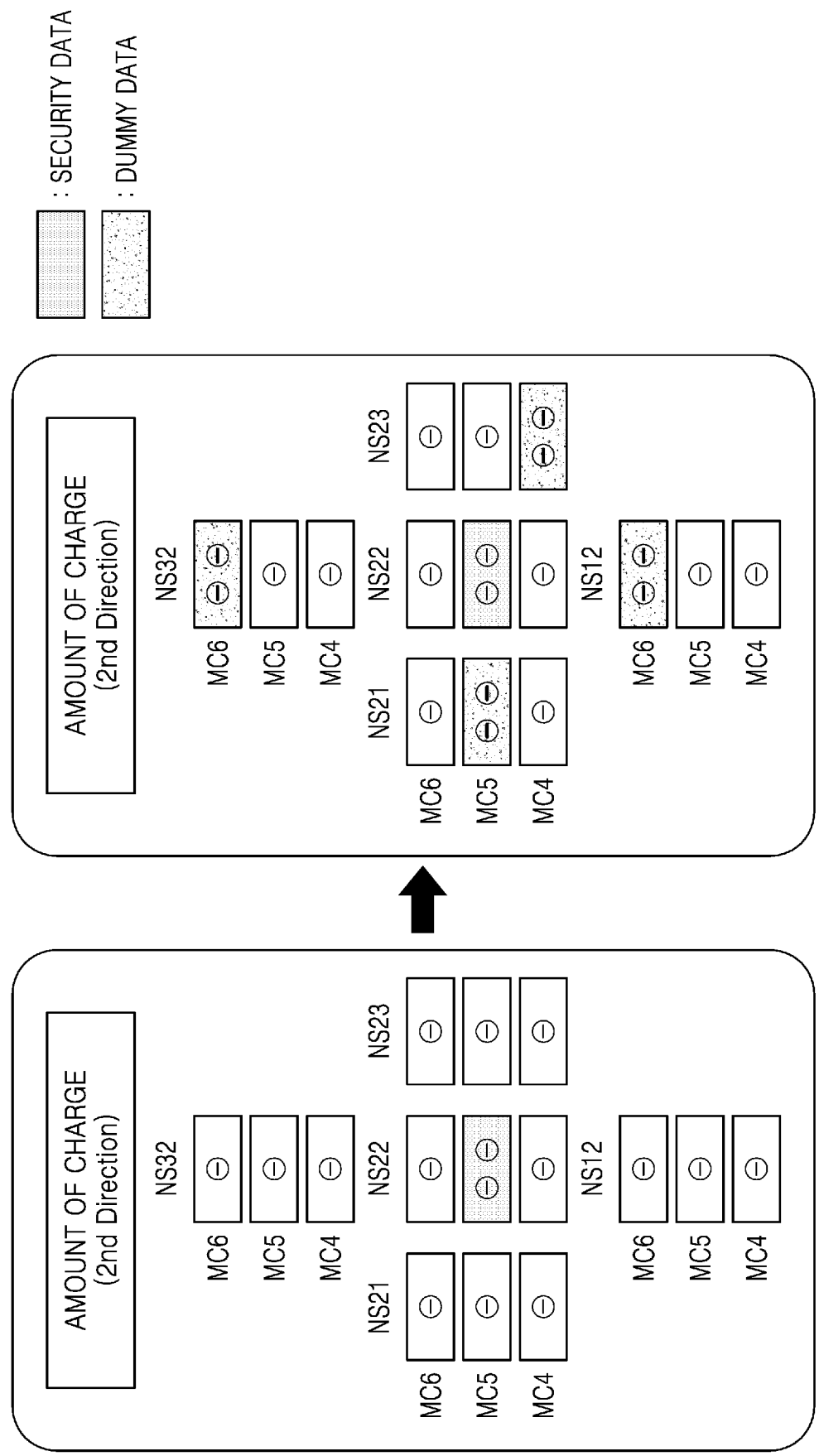
FIG. 16B is a diagram showing a dummy data write operation regarding the memory cell group according to an example embodiment.
Figure 16C:
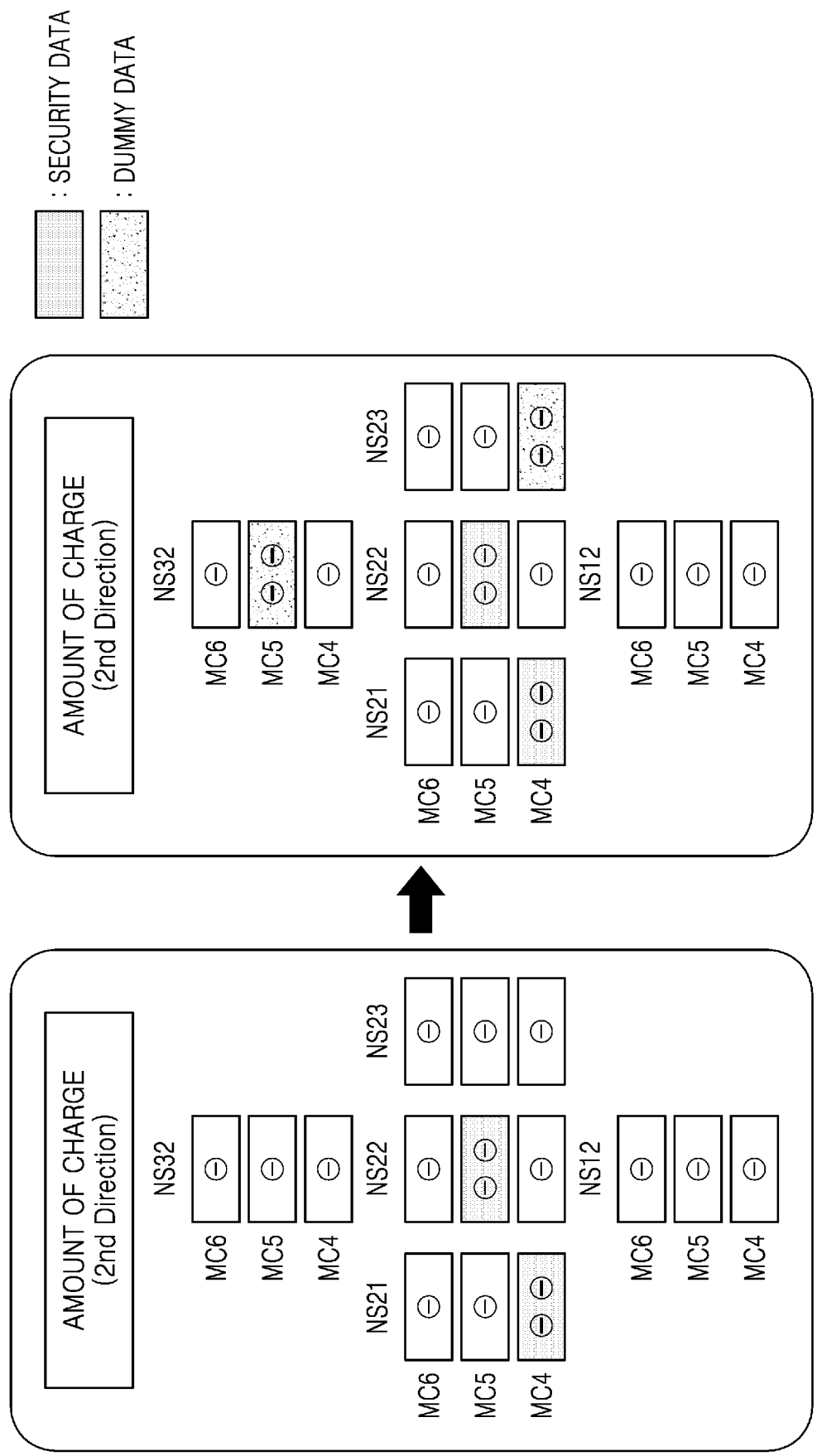
FIG. 16C is a diagram showing a dummy data write operation regarding the memory cell group according to an example embodiment.

FIG. 16A is a diagram showing a memory cell group according to an example embodiment, FIG. 16B is a diagram showing a dummy data write operation regarding the memory cell group according to an example embodiment, and FIG. 16C is a diagram showing a dummy data write operation regarding the memory cell group according to an example embodiment. In detail, FIGS. 16A to 16C are diagrams for describing the method of operating a memory system of FIG. 15 in detail.

FIG. 16A shows cell strings NS11, NS21, and NS31 connected to a first bit line BL1, cell strings NS12, NS22, and NS32 connected to a second bit line BL2, and cell strings NS13, NS23, and NS33 connected to a third bit line BL3 in memory cell arrays of the memory block BLK1. Referring to FIG. 16A, the memory system 10 of FIG. 1 may split security data that needs security and write one of the pieces of split security data to a memory cell MC5 of the cell string NS22 connected to the second bit line BL2.

The memory system 10 may select a memory cell group corresponding to the memory cell MC5 to which the security data is written. In detail, the memory system 10 may select a memory cell group including at least some of memory cells located within a pre-set distance (e.g., a distance between memory cells adjacent to each other) from the memory cell MC5 to which the security data is written.

For example, referring to FIG. 16A, the memory system 10 may select a memory cell group including memory cells MC4, MC5, and MC6 of the cell string NS21 of the first bit line BL1, memory cells MC4, MC5, and MC6 of each of the cell strings NS12, NS22, and NS32 of the second bit line BL2, and memory cells MC4, MC5, and MC6 of a cell string NS23 of the third bit line BL3. Next, the memory system 10 may determine to write dummy data to the selected memory cell group.

Referring to FIG. 16B, a charge amount of each of the memory cells included in a memory cell group viewed in the second direction (e.g., X direction) after the security data is written may be seen. Because the security data is written only to the memory cell MC5 of the cell string NS22, only the memory cell MC5 may have a charge amount of 2, and the remaining memory cells may each have a charge amount of 1.

The memory system 10 may generate dummy data that makes the final charge amounts of a plurality of strings (e.g., a plurality of cell strings NS12, NS21, NS22, NS23, and NS32) included in the memory cell group to be the same. Because the current charge amount of the cell string NS22 of the memory cell group is 4, and the current charge amount of each of cell strings NS12, NS21, NS23, and NS32 is 3, the memory system 10 may generate dummy data that makes the final charge amount of each of the cell strings NS12, NS21, NS23, and NS32 to have a value equal to or greater than 4. For example, the memory system 10 may determine the final charge amount of each of the cell strings NS12, NS21, NS23, and NS32. The final charge amounts may be the same. The final charge amounts may correspond to a current charge amount that is stored one of the cell strings NS12, NS21, NS23, and NS32. The final charge amounts may be greater than the current charge amount that is stored on each of the cell strings NS12, NS21, NS23, and NS32. The dummy data may be generated based on the final charge amounts. For example, referring to FIG. 16B, when the final charge amount of each of the cell strings NS12, NS21, NS23, and NS32 is determined to be 4, the memory system 10 may generate dummy data for increasing the current charge amount of each of the cell strings NS12, NS21, NS23, and NS32 by 1. Furthermore, the memory system 10 may write generated dummy data to at least one memory cell of each of the cell strings NS12, NS21, NS23, and NS32.

Example embodiments are not limited to the operation in which the memory system 10 generates dummy data in relation to a memory cell group and writes the dummy data is not limited to the above example, and the memory system 10 may generate and write dummy data in various ways. For example, the memory system 10 may generate dummy data that makes only some of strings included in a memory cell group to have the same charge amount and write the calculated dummy data to memory cells connected to the at least some strings.

For example, referring to FIG. 16C, dummy data that makes only some NS21, NS22, NS23, and NS32 of the cell strings NS12, NS21, NS22, NS23, and NS32 constituting the memory cell group to have the same charge amount may be generated. Because security data is written to the cell strings NS21 and NS22, the charge amount of each of them has a value of 4. On the other hand, because security data is not written to cell strings NS23 and NS32, the charge amount of each of them has a value of 3. Therefore, the memory system 10 may generate dummy data that makes the final charge amounts of the cell strings NS23 and NS32 to have a value of 4. Next, the memory system 10 may write generated dummy data to memory cells of cell strings NS23 and NS32.

Although descriptions have been given above with reference to FIGS. 1 to 16C under an assumption that memory cells are SLCs, example embodiments are not limited thereto, and the memory cells may each be an SLC, an MLC, a TLC, or a QLC. When memory cells are MLCs, TLCs, or QLCs, only values of data stored in the memory cells and information regarding the magnitude of charge amounts corresponding thereto vary, and a memory system may operate in the same manner as in the example embodiments described above. Therefore, descriptions identical to those already given above will be omitted.

Figure 17:
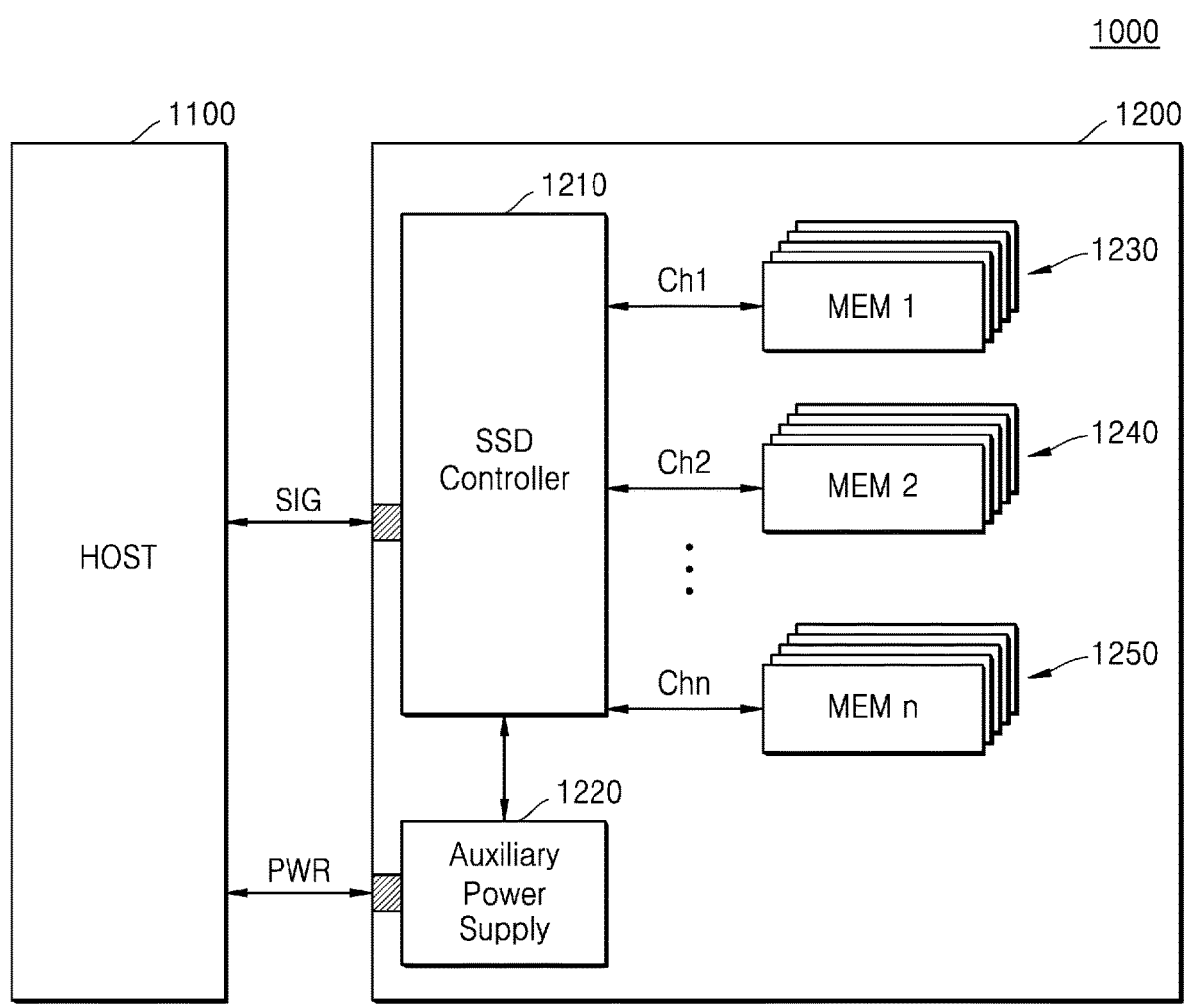
FIG. 17 is a block diagram showing an SSD system according to an example embodiment.

FIG. 17 is a block diagram showing an SSD system according to an example embodiment.

Referring to FIG. 17, an SSD system 1000 may include a host 1100 and an SSD 1200. The SSD 1200 may exchange signals with the host 1100 through an interface and may receive power through a power interface. The SSD 1200 may include an SSD controller 1210, an auxiliary power supply device 1220, and a plurality of memory devices 1230, 1240, and 1250. Here, the SSD 1200 may be implemented according to the example embodiments described above with reference to FIGS. 1 to 16D.

In one example embodiment, the SSD controller 1210 may split security data that needs security and write the split security data to distributed memory cells of at least one of the memory devices 1230, 1240, and 1250. Also, the SSD controller 1210 may additionally write dummy data to memory cells adjacent to or non-adjacent to the memory cells to which the security data is written.

According to the above-described example embodiments, the SSD system 1000 may provide a write function with enhanced security. In detail, the SSD system 1000 may enhance security by splitting and storing data that needs security and further enhance security by writing dummy data to adjacent or non-adjacent memory cells.

Figure 18:
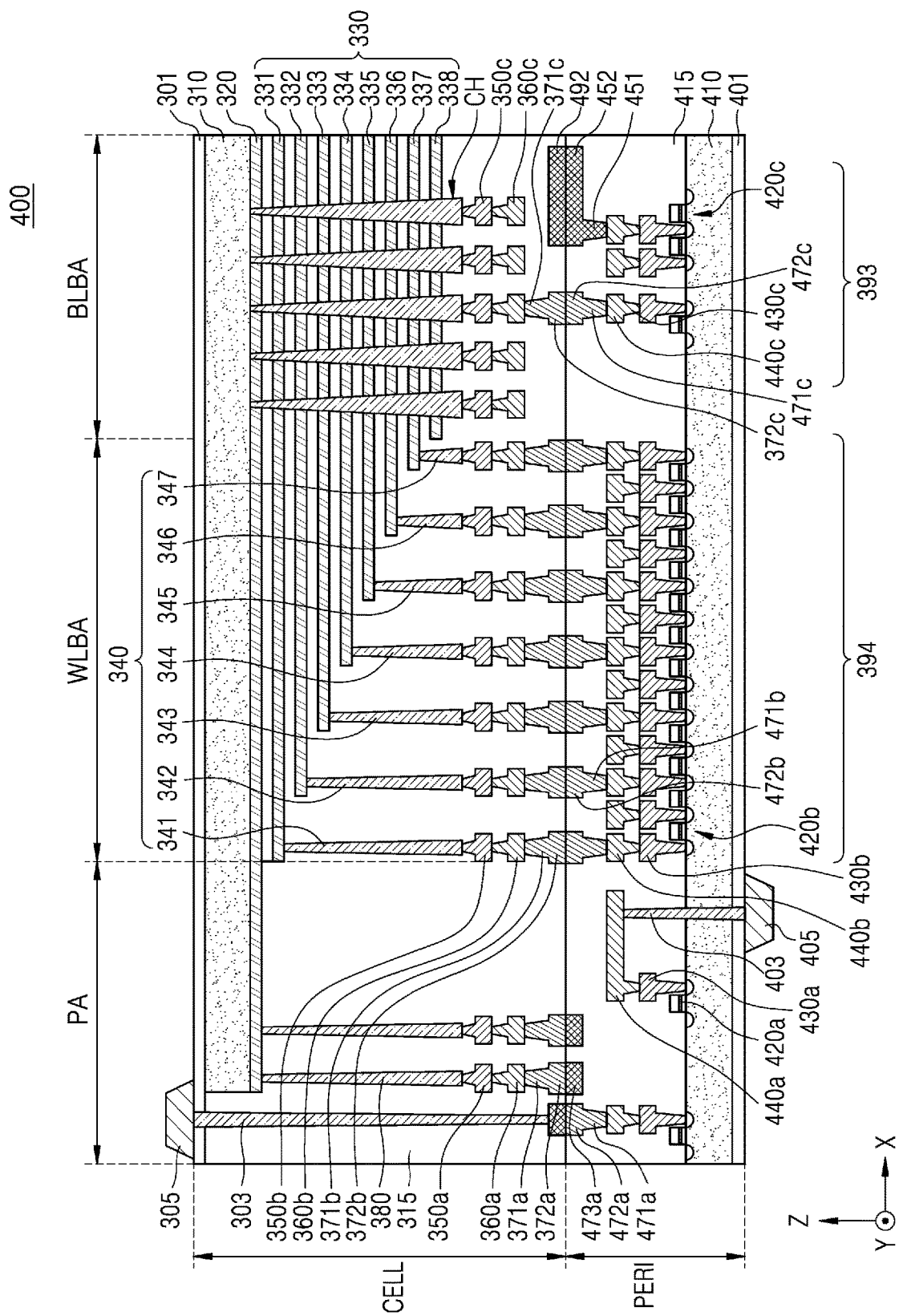
FIG. 18 is a diagram showing the structure of a memory device 400 according to an example embodiment.

Referring to FIG. 18, a memory device 400 may have a chip-to-chip (C2C) structure. The C2C structure may refer to a structure formed by manufacturing an upper chip including a cell region CELL on a first wafer, manufacturing a lower chip including a peripheral circuit region PERI on a second wafer, different from the first wafer, and then connecting the upper chip and the lower chip in a bonding manner. For example, the bonding manner may include a method of electrically connecting a bonding metal formed on an uppermost metal layer of the upper chip and a bonding metal formed on an uppermost metal layer of the lower chip. For example, when the bonding metals are formed of copper (Cu), the bonding manner is a Cu—Cu bonding. However, example embodiments are not limited thereto and the bonding metals may also be formed of aluminum or tungsten.

Each of the peripheral circuit region PERI and the cell region CELL of the memory device 40 may include an external pad bonding area PA, a word line bonding area WLBA, and a bit line bonding area BLBA.

The peripheral circuit region PERI may include a first substrate 410, an interlayer insulating layer 415, a plurality of circuit elements 420a, 420b, and 420c formed on the first substrate 410, first metal layers 430a, 430b, and 430c respectively connected to the plurality of circuit elements 420a, 420b, and 420c, and second metal layers 440a, 440b, and 440c formed on the first metal layers 430a, 430b, and 430c. In an example embodiment, the first metal layers 430a, 430b, and 430c may be formed of tungsten having relatively high resistance, and the second metal layers 440a, 440b, and 440c may be formed of copper having relatively low resistance.

Although the first metal layers 430a, 430b, and 430c and the second metal layers 440a, 440b, and 440c are shown and described, example embodiments are not limited thereto, and one or more metal layers may be further formed on the second metal layers 440a, 440b, and 440c. At least a portion of the one or more metal layers formed on the second metal layers 440a, 440b, and 440c may be formed of aluminum or the like having a lower resistance than those of copper forming the second metal layers 440a, 440b, and 440c.

The interlayer insulating layer 415 may be disposed on the first substrate 410 and cover the plurality of circuit elements 420a, 420b, and 420c, the first metal layers 430a, 430b, and 430c, and the second metal layers 440a, 440b, and 440c. The interlayer insulating layer 415 may include an insulating material such as silicon oxide, silicon nitride, or the like.

Lower bonding metals 471b and 472b may be formed on the second metal layer 440b in the word line bonding area WLBA. In the word line bonding area WLBA, the lower bonding metals 471b and 472b in the peripheral circuit region PERI may be electrically connected to c in a bonding manner, and the lower bonding metals 471b and 472b and the upper bonding metals 371b and 372b may be formed of aluminum, copper, tungsten, or the like. Further, the upper bonding metals 371b and 372b in the cell region CELL may be referred as first metal pads and the lower bonding metals 471b and 472b in the peripheral circuit region PERI may be referred as second metal pads.

The cell region CELL may include at least one memory block. The cell region CELL may include a second substrate 310 and a common source line 320. On the second substrate 310, a plurality of word lines 331 to 338 (i.e., 330) may be stacked in a direction (a Z-axis direction), perpendicular to an upper surface of the second substrate 310. At least one string select line and at least one ground select line may be arranged on and below the plurality of word lines 330, respectively, and the plurality of word lines 330 may be disposed between the at least one string select line and the at least one ground select line.

In the bit line bonding area BLBA, a channel structure CH may extend in a direction, perpendicular to the upper surface of the second substrate 310, and pass through the plurality of word lines 330, the at least one string select line, and the at least one ground select line. The channel structure CH may include a data storage layer, a channel layer, a buried insulating layer, and the like, and the channel layer may be electrically connected to a first metal layer 350c and a second metal layer 360c. For example, the first metal layer 350c may be a bit line contact, and the second metal layer 360c may be a bit line. In an example embodiment, the bit line 360c may extend in a first direction (a Y-axis direction), parallel to the upper surface of the second substrate 310.

In an example embodiment illustrated in FIG. 18, an area in which the channel structure CH, the bit line 360c, and the like are disposed may be defined as the bit line bonding area BLBA. In the bit line bonding area BLBA, the bit line 360c may be electrically connected to the circuit elements 420c providing a page buffer 393 in the peripheral circuit region PERI. For example, the bit line 360c may be connected to upper bonding metals 371c and 372c in the cell region CELL, and the upper bonding metals 371c and 372c may be connected to lower bonding metals 471c and 472c connected to the circuit elements 420c of the page buffer 393.

In the word line bonding area WLBA, the plurality of word lines 330 may extend in a second direction (an X-axis direction), parallel to the upper surface of the second substrate 310, and may be connected to a plurality of cell contact plugs 341 to 347 (i.e., 340). The plurality of word lines 330 and the plurality of cell contact plugs 340 may be connected to each other in pads provided by at least a portion of the plurality of word lines 330 extending in different lengths in the second direction. A first metal layer 350b and a second metal layer 360b may be connected to an upper portion of the plurality of cell contact plugs 340 connected to the plurality of word lines 330, sequentially. The plurality of cell contact plugs 340 may be connected to the circuit region PERI by the upper bonding metals 371b and 372b of the cell region CELL and the lower bonding metals 471b and 472b of the peripheral circuit region PERI in the word line bonding area WLBA.

The plurality of cell contact plugs 340 may be electrically connected to the circuit elements 420b providing a row decoder 394 in the peripheral circuit region PERI. In an example embodiment, operating voltages of the circuit elements 420b providing the row decoder 394 may be different than operating voltages of the circuit elements 420c providing the page buffer 393. For example, operating voltages of the circuit elements 420c providing the page buffer 393 may be greater than operating voltages of the circuit elements 420b providing the row decoder 394.

A common source line contact plug 380 may be disposed in the external pad bonding area PA. The common source line contact plug 380 may be formed of a conductive material such as a metal, a metal compound, polysilicon, or the like, and may be electrically connected to the common source line 320. A first metal layer 350a and a second metal layer 360a may be stacked on an upper portion of the common source line contact plug 380, sequentially. For example, an area in which the common source line contact plug 380, the first metal layer 350a, and the second metal layer 360a are disposed may be defined as the external pad bonding area PA.

Input-output pads 405 and 305 may be disposed in the external pad bonding area PA. Referring to FIG. 18, a lower insulating film 401 covering a lower surface of the first substrate 410 may be formed below the first substrate 410, and a first input-output pad 405 may be formed on the lower insulating film 401. The first input-output pad 405 may be connected to at least one of the plurality of circuit elements 420a, 420b, and 420c disposed in the peripheral circuit region PERI through a first input-output contact plug 403, and may be separated from the first substrate 410 by the lower insulating film 401. In addition, a side insulating film may be disposed between the first input-output contact plug 403 and the first substrate 410 to electrically separate the first input-output contact plug 403 and the first substrate 410.

Referring to FIG. 18, an upper insulating film 301 covering the upper surface of the second substrate 310 may be formed on the second substrate 310, and a second input-output pad 305 may be disposed on the upper insulating film 301. The second input-output pad 305 may be connected to at least one of the plurality of circuit elements 420a, 420b, and 420c disposed in the peripheral circuit region PERI through a second input-output contact plug 303.

According to example embodiments, the second substrate 310 and the common source line 320 may not be disposed in an area in which the second input-output contact plug 303 is disposed. Also, the second input-output pad 305 may not overlap the word lines 330 in the third direction (the Z-axis direction). Referring to FIG. 18, the second input-output contact plug 303 may be separated from the second substrate 310 in a direction, parallel to the upper surface of the second substrate 310, and may pass through the interlayer insulating layer 315 of the cell region CELL to be connected to the second input-output pad 305.

According to example embodiments, the first input-output pad 405 and the second input-output pad 305 may be selectively formed. For example, the memory device 400 may include only the first input-output pad 405 disposed on the first substrate 410 or only the second input-output pad 305 disposed on the second substrate 310. Alternatively, the memory device 400 may include both the first input-output pad 405 and the second input-output pad 305.

A metal pattern in an uppermost metal layer may be provided as a dummy pattern or the uppermost metal layer may be absent, in each of the external pad bonding area PA and the bit line bonding area BLBA, respectively included in the cell region CELL and the peripheral circuit region PERI.

In the external pad bonding area PA, the memory device 400 may include a lower metal pattern 473a, corresponding to an upper metal pattern 372a formed in an uppermost metal layer of the cell region CELL, and having the same shape as the upper metal pattern 372a of the cell region CELL, in an uppermost metal layer of the peripheral circuit region PERI. In the peripheral circuit region PERI, the lower metal pattern 473a formed in the uppermost metal layer of the peripheral circuit region PERI may not be connected to a contact. Similarly, in the external pad bonding area PA, an upper metal pattern, corresponding to the lower metal pattern formed in an uppermost metal layer of the peripheral circuit region PERI, and having the same shape as a lower metal pattern of the peripheral circuit region PERI, may be formed in an uppermost metal layer of the cell region CELL.

The lower bonding metals 471b and 472b may be formed on the second metal layer 440b in the word line bonding area WLBA. In the word line bonding area WLBA, the lower bonding metals 471b and 472b of the peripheral circuit region PERI may be electrically connected to the upper bonding metals 371b and 372b of the cell region CELL by a Cu—Cu bonding.

Further, the bit line bonding area BLBA, an upper metal pattern 392, corresponding to a lower metal pattern 452 formed in the uppermost metal layer of the peripheral circuit region PERI, and having the same shape as the lower metal pattern 452 of the peripheral circuit region PERI, may be formed in an uppermost metal layer of the cell region CELL. A contact may not be formed on the upper metal pattern 392 formed in the uppermost metal layer of the cell region CELL.

In an example embodiment, corresponding to a metal pattern formed in an uppermost metal layer in one of the cell region CELL and the peripheral circuit region PERI, a reinforcement metal pattern having the same shape as the metal pattern may be formed in an uppermost metal layer in another one of the cell region CELL and the peripheral circuit region PERI, and a contact may not be formed on the reinforcement metal pattern.

According to an example embodiment, the memory device 400 may be implemented according to the above-described example embodiments with reference to FIGS. 1 to 16. For example, the memory device 400 may store security data in first memory cells and dummy data in second memory cells adjacent to the first memory cells. The method of storing dummy data may be substantially the same as the method described above with reference to FIGS. 1 to 16, and thus redundant descriptions will be omitted.

While example embodiments have been particularly shown and described, it will be understood that various changes in form and details may be made therein without departing from the spirit and scope of the following claims.

What is claimed is:

1. A memory system comprising:
 a memory device comprising a plurality of memory cells; and
 a memory controller configured to control the memory device to:
  store write data in first memory cells from among the plurality of memory cells,
  identify a current charge amount of a first cell string comprising at least one of the first memory cells and a current charge amount of a second cell string adjacent to the first cell string, and
  store dummy data in at least one memory cell connected to the first cell string or the second cell string based on the current charge amount of the first cell string and the current charge amount of the second cell string.

2. The memory system of claim 1, wherein the memory controller is further configured to generate the dummy data to make a ratio between a final charge amount of the first cell string and a final charge amount of the second cell string correspond to a pre-set ratio after the dummy data is stored in the at least one memory cell.

3. The memory system of claim 2, wherein the pre-set ratio is 1:1.

4. The memory system of claim 3, wherein the memory controller is further configured to:
 identity a first charge amount based on the current charge amount of the first cell string and the current charge amount of the second cell string, generate first dummy data to make the final charge amount of the first cell string correspond to the first charge amount, and generate second dummy data to make the final charge amount of the second cell string correspond to the first charge amount.

5. The memory system of claim 4, wherein the memory controller is further configured to identify the first charge amount based on a largest charge amount from between the current charge amount of the first cell string and the current charge amount of the second cell string.

6. The memory system of claim 4, wherein the memory controller is further configured to control the memory device to:

store the first dummy data in at least one second memory cell connected to the first cell string, and store the second dummy data in at least one third memory cell connected to the second cell string.

7. The memory system of claim 1, wherein the memory controller is further configured to:

identify a current charge amount of fourth memory cells that comprise at least two of the first memory cells and are successively arranged in the first cell string, and identify a current charge amount of fifth memory cells included in the second cell string which are adjacent to the fourth memory cells of the first cell string.

8. The memory system of claim 7, wherein the memory controller is further configured to generate the dummy data to make a final charge amount of the fourth memory cells correspond to a final charge amount of the fifth memory cells based on the current charge amount of the fourth memory cells and the current charge amount of the fifth memory cells.

9. The memory system of claim 8, wherein the memory controller is further configured to store the dummy data in at least some of the fourth memory cells and the fifth memory cells.

10. The memory system of claim 1, wherein the first memory cells are disposed in a pre-set memory region of the memory device.

11. The memory system of claim 1, wherein the memory controller is further configured to randomly select the first memory cells from among the plurality of memory cells.

12. A memory system comprising:

a memory device comprising a plurality of memory cells; and a memory controller configured to control the memory device to:

store write data in first memory cells from among the plurality of memory cells, identify a memory cell group which corresponds to the first memory cells, generate dummy data based on charge amounts of second memory cells included in the identified memory cell group, and store the dummy data in the second memory cells.

13. An operating method of a memory system comprising a memory device, the operating method comprising:

storing write data in first memory cells of the memory device;

identifying a current charge amount of a first cell string comprising at least one of the first memory cells and a current charge amount of a second cell string adjacent to the first cell string; and storing dummy data in at least one memory cell connected to the first cell string or the second cell string based on the current charge amount of the first cell string and the current charge amount of the second cell string.

14. The operating method of claim 13, wherein the storing of the dummy data comprises:

generating the dummy data to make a ratio between a final charge amount of the first cell string and a final charge amount of the second cell string correspond to a pre-set ratio; and storing the dummy data in the at least one memory cell.

15. The operating method of claim 14, wherein the pre-set ratio is 1:1.

16. The operating method of claim 15, wherein the generating of the dummy data comprises:

identifying a first charge amount based on the current charge amount of the first cell string and the current charge amount of the second cell string;

generating first dummy data to make the final charge amount of the first cell string correspond to the first charge amount; and generating second dummy data to make the final charge amount of the second cell string correspond to the first charge amount.

17. The operating method of claim 16, wherein the storing of the dummy data in the at least one memory cell comprises:

storing the first dummy data in at least one second memory cell connected to the first cell string; and storing the second dummy data in at least one third memory cell connected to the second cell string.

18. The operating method of claim 13, further comprising:

identifying a current charge amount of fourth memory cells that comprise at least two of the first memory cells and are successively arranged in the first cell string; and identifying a current charge amount of fifth memory cells adjacent to the fourth memory cells from among memory cells included in the second cell string.

19. The operating method of claim 18, wherein the dummy data is generated to make a final charge amount of the fourth memory cells correspond to a final charge amount of the fifth memory cells based on the current charge amount of the fourth memory cells and the current charge amount of the fifth memory cells, and wherein the storing of the dummy data comprises storing the dummy data in at least some of the fourth memory cells and the fifth memory cells.

20. The operating method of claim 13, wherein, in the storing of the write data, the write data is stored in the first memory cells randomly selected from among memory cells of the memory device.

* * * * *